(12) United States Patent
Kim et al.

(10) Patent No.: US 12,262,535 B2
(45) Date of Patent: Mar. 25, 2025

(54) SEMICONDUCTOR DEVICE AND A DATA STORAGE SYSTEM INCLUDING THE SAME

(71) Applicant: SAMSUNG ELECTRONICS CO., LTD., Suwon-si (KR)

(72) Inventors: Jongsoo Kim, Seoul (KR); Sunil Shim, Seoul (KR); Juyoung Lim, Seoul (KR); Wonseok Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 701 days.

(21) Appl. No.: 17/507,929

(22) Filed: Oct. 22, 2021

(65) Prior Publication Data

US 2022/0254807 A1   Aug. 11, 2022

(30) Foreign Application Priority Data

Feb. 10, 2021   (KR) .................. 10-2021-0018807

(51) Int. Cl.
*H10B 43/27* (2023.01)
*H01L 23/528* (2006.01)
*H10B 41/10* (2023.01)
*H10B 41/27* (2023.01)
*H10B 41/35* (2023.01)
*H10B 41/40* (2023.01)
*H10B 43/10* (2023.01)
(Continued)

(52) U.S. Cl.
CPC ......... *H10B 43/27* (2023.02); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
CPC ................................ H10B 43/27; H10B 43/20
See application file for complete search history.

(56) References Cited

U.S. PATENT DOCUMENTS

| 10,170,248 B2 | 1/2019 | Kwong |
| 10,381,371 B2 | 8/2019 | Ogawa et al. |
| 10,490,569 B2 | 11/2019 | Mushiga et al. |

(Continued)

FOREIGN PATENT DOCUMENTS

KR   10-2010-0091900   8/2010

*Primary Examiner* — Christopher A Johnson
(74) *Attorney, Agent, or Firm* — F. CHAU & ASSOCIATES, LLC

(57) ABSTRACT

A semiconductor device including: a memory cell array region and a staircase region on a pattern structure; a stack structure including insulating layers and gate layers with gate pads alternately stacked in a vertical direction; a separation structure penetrating through the stack structure and contacting the pattern structure; a memory vertical structure penetrating through the stack structure and contacting the pattern structure; a support vertical structure penetrating through the stack structure and contacting the pattern structure; gate contact plugs disposed on the gate pads; and a peripheral contact plug spaced apart from the gate layers, wherein an upper surface of the memory vertical structure is at a first level, an upper surface of the peripheral contact plug is at a second level, an upper surface of the separation structure is at a third level, and upper surfaces of the gate contact plugs are at a fourth level.

20 Claims, 20 Drawing Sheets

(51) Int. Cl.
 *H10B 43/35* (2023.01)
 *H10B 43/40* (2023.01)

(56) References Cited

U.S. PATENT DOCUMENTS

| | | |
|---|---|---|
| 10,546,867 B2 | 1/2020 | Matsuda |
| 10,573,657 B2 | 2/2020 | Baek et al. |
| 10,636,806 B2 | 4/2020 | Lee |
| 2010/0202206 A1 | 8/2010 | Seol et al. |
| 2019/0326319 A1* | 10/2019 | Yun ........................ H01L 23/528 |
| 2020/0035694 A1 | 1/2020 | Kaminaga |

* cited by examiner

'A'

SEMICONDUCTOR DEVICE AND A DATA STORAGE SYSTEM INCLUDING THE SAME

This application claims priority under 35 U.S.C. § 119 to Korean Patent Application No. 10-2021-0018807 filed on Feb. 10, 2021 in the Korean Intellectual Property Office, the disclosure of which is incorporated by reference herein in its entirety.

TECHNICAL FIELD

Example embodiments of the present disclosure relate to a semiconductor device and a data storage system including the same.

DISCUSSION OF RELATED ART

There is an increasing demand for semiconductor devices that can store large amounts of data. One technique for increasing data storage capacity of a semiconductor device, involves arranging memory cells of a semiconductor device three-dimensionally, rather than two-dimensionally.

SUMMARY

An example embodiment of the present disclosure is to provide a semiconductor device which may increase integration density and reliability.

An example embodiment of the present disclosure is to provide a data storage system including a semiconductor device.

According to an example embodiment of the present disclosure, there is provided a semiconductor device including: a memory cell array region and a staircase region on a pattern structure; a stack structure disposed in the memory cell array region and extending from the memory cell array region into the staircase region, wherein the stack structure includes interlayer insulating layers and gate layers alternately stacked in a vertical direction perpendicular to an upper surface of the pattern structure, and the gate layers include gate pads arranged in a staircase shape in the staircase region; a separation structure penetrating through the stack structure and in contact with the pattern structure; a memory vertical structure penetrating through the stack structure in the memory cell array region and in contact with the pattern structure; a support vertical structure penetrating through the stack structure in the staircase region and in contact with the pattern structure; gate contact plugs disposed on the gate pads; and a first peripheral contact plug spaced apart from the gate layers, wherein the separation structure extends from the memory cell array region toward the staircase region in a first horizontal direction parallel to the upper surface of the pattern structure, wherein an upper surface of the memory vertical structure is disposed at a first level, wherein an upper surface of the first peripheral contact plug is disposed at a second level higher than the first level, wherein an upper surface of the separation structure is disposed at a third level higher than the second level, and wherein upper surfaces of the gate contact plugs are disposed at a fourth level higher than the third level.

According to an example embodiment of the present disclosure, there is provided a semiconductor device including: a first structure; a second structure overlapping the first structure in a vertical direction; a memory vertical structure; a support vertical structure; a peripheral contact plug; a separation structure; and gate contact plugs, wherein the first structure includes a pattern structure including a silicon layer, wherein the second structure includes gate layers stacked and spaced apart from each other in the vertical direction in a memory cell array region and extending from the memory cell array region into a staircase region adjacent to the memory cell array region, wherein the gate layers include gate pads arranged in the staircase region, wherein the memory vertical structure contacts the pattern structure and penetrates through the gate layers in the memory cell array region, wherein the support vertical structure contacts the pattern structure and penetrates through the gate layers in the staircase region, wherein the peripheral contact plug is spaced apart from the gate layers, wherein the separation structure contacts the pattern structure and penetrates through the second structure, wherein the gate contact plugs are disposed on the gate pads, wherein an upper surface of the memory vertical structure is disposed at a first level, wherein an upper surface of the peripheral contact plug is disposed at a second level, wherein an upper surface of the separation structure is disposed at a third level, wherein upper surfaces of the gate contact plugs are disposed at a fourth level, and wherein the first to fourth levels are disposed at different levels.

According to an example embodiment of the present disclosure, there is provided a data storage system including: a substrate; a semiconductor device on the substrate; and a controller electrically connected to the semiconductor device and controlling the semiconductor device, wherein the semiconductor device includes: a memory cell array region and a staircase region on a pattern structure; a stack structure disposed in the memory cell array region and extending from the memory cell array region into the staircase region, wherein the stack structure includes interlayer insulating layers and gate layers alternately stacked in a vertical direction, and the gate layers include gate pads arranged in a staircase shape in the staircase region; a separation structure contacting the pattern structure and penetrating through the stack structure; a memory vertical structure contacting the pattern structure and penetrating through the stack structure in the memory cell array region; a support vertical structure contacting the pattern structure and penetrating through the stack structure in the staircase region; gate contact plugs disposed on the gate pads; and a first peripheral contact plug spaced apart from the gate layers, wherein an upper surface of the memory vertical structure is disposed at a first level, wherein an upper surface of the first peripheral contact plug is disposed at a second level higher than the first level, wherein an upper surface of the separation structure is disposed at a third level higher than the second level, wherein upper surfaces of the gate contact plugs are disposed at a fourth level higher than the third level, wherein the memory vertical structure includes a channel layer, and wherein the support vertical structure does not include a material of the channel layer.

According to an example embodiment of the present disclosure, there is provided a method of manufacturing a semiconductor device, the method including: forming a first structure; forming a second structure on the first structure, wherein the second structure includes a preliminary stack structure including interlayer insulating layers and horizontal layers alternately stacked, and a capping insulating layer covering at least a portion of the preliminary stack structure, and wherein the horizontal layers include pad regions; forming a memory vertical structure penetrating through the preliminary stack structure of the second structure; forming a first upper insulating layer covering the second structure; simultaneously forming a peripheral contact plug and a dummy plug penetrating through the first upper insulating layer and the second structure; replacing the dummy plug with a support vertical structure; forming a second upper insulating layer on the first upper insulating layer; forming separation trenches penetrating the first and second upper insulating layers; forming empty spaces by etching the horizontal layers exposed by the separation trenches; forming the preliminary stack structure as a stack structure including gate layers by forming the gate layers in the empty spaces; and forming separation structures within the separation trenches.

BRIEF DESCRIPTION OF DRAWINGS

The above and other features of the present disclosure will be more clearly understood from the following detailed description, taken in conjunction with the accompanying drawings, in which.

DETAILED DESCRIPTION OF THE EMBODIMENTS

Hereinafter, example embodiments of the present disclosure will be described with reference to the accompanying drawings.

Figure 1:
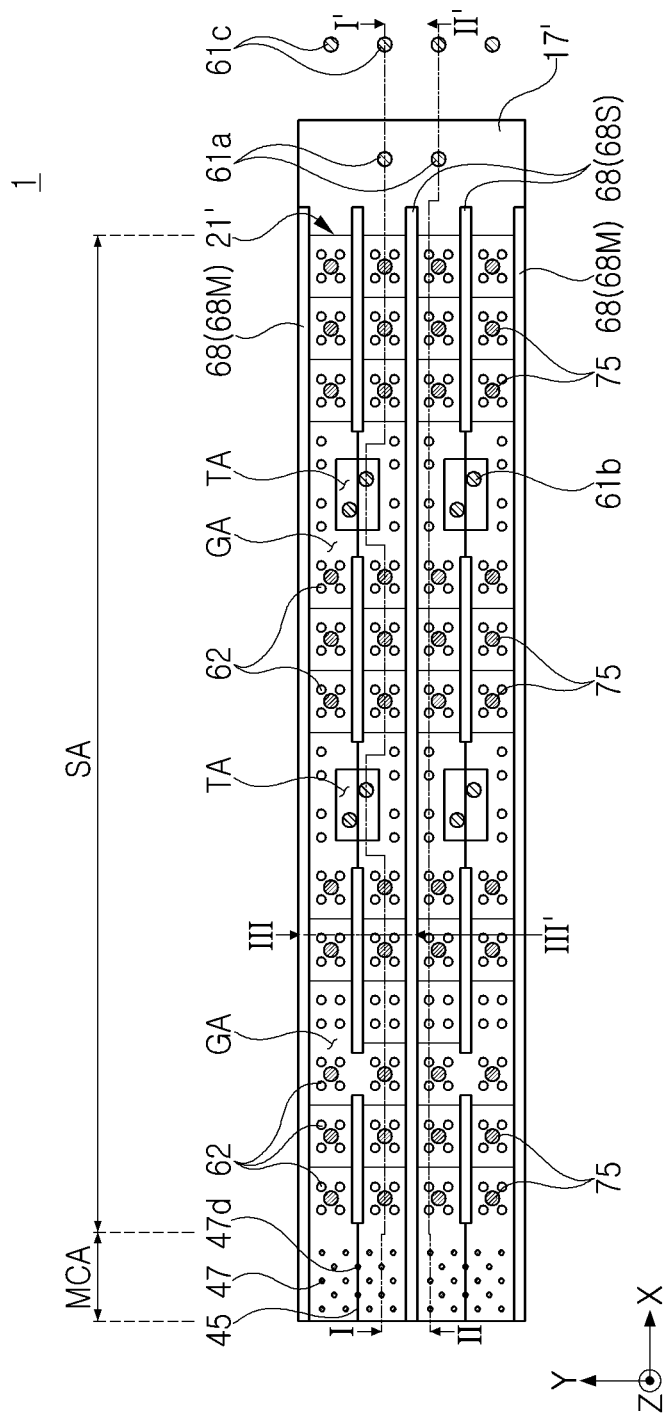
FIG. 1 is a plan diagram illustrating an example of a semiconductor device according to an example embodiment of the present disclosure.
Figure 2A:
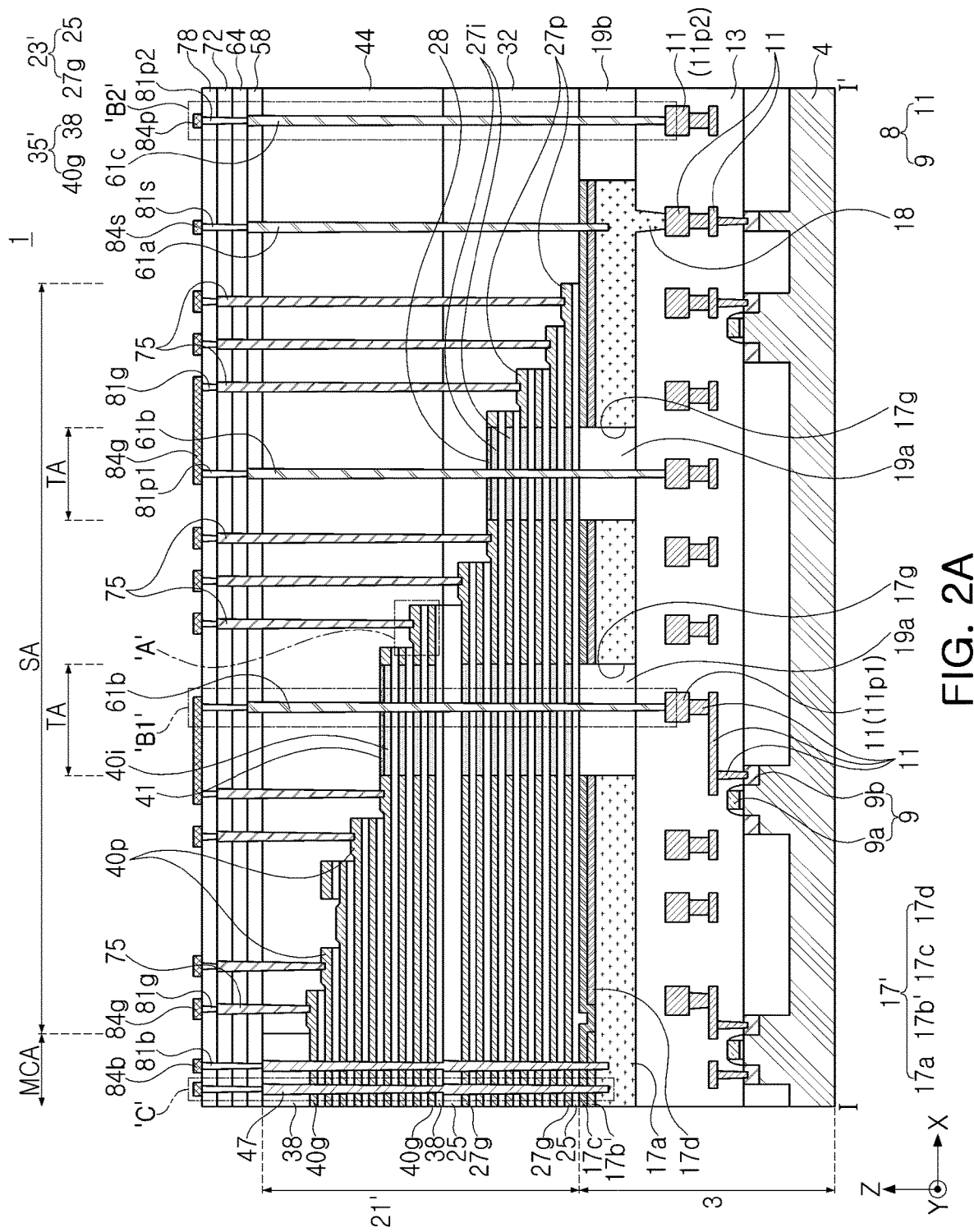
FIGS. 2A, 2B and 2C are cross-sectional diagrams illustrating an example of a semiconductor device according to an example embodiment of the present disclosure.
Figure 2B:
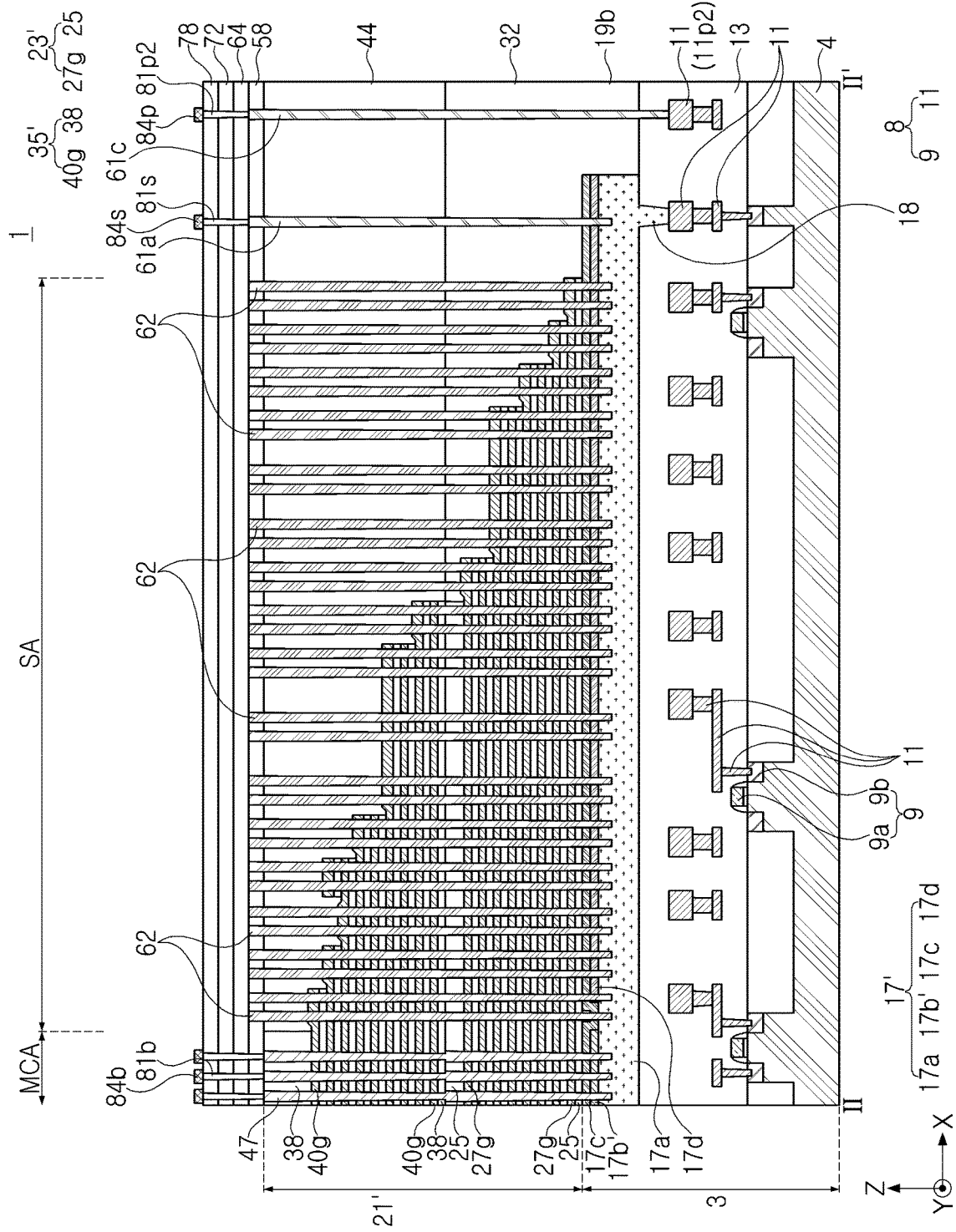

An example of a semiconductor device will be described with reference to FIGS. 1 to 2C. FIG. 1 is a plan diagram illustrating an example of a semiconductor device according to an example embodiment of the present disclosure, FIG. 2A is a cross-sectional diagram illustrating a region taken along line I-I' in FIG. 1, FIG. 2B is a cross-sectional diagram illustrating a region taken along line II-II' in FIG. 1, and FIG. 2C is a cross-sectional diagram illustrating a region taken along line III-III' in FIG. 1.

Figure 2C:
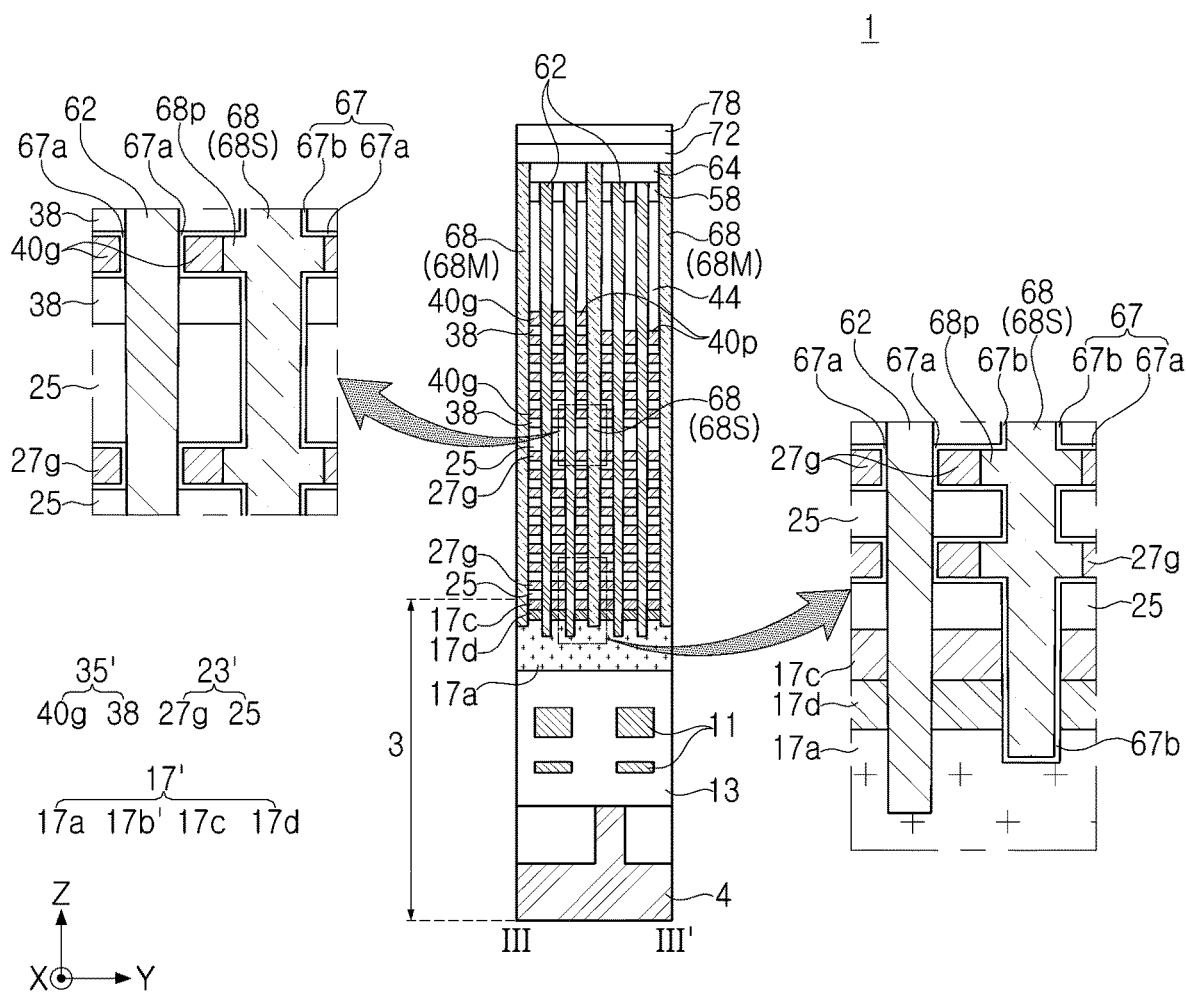

Referring to FIGS. 1 to 2C, a semiconductor device 1 according to an example embodiment of the present disclosure may include a first structure 3 and a second structure 21 overlapping the first structure 3 in a vertical direction Z.

In an example, the first structure 3 may include a pattern structure 17'. The pattern structure 17' may include at least one silicon layer.

In an example, the pattern structure 17' may include a first pattern layer 17a, a second pattern layer 17b', a third pattern layer 17c, and a fourth pattern layer 17d. The second pattern layer 17b' and the fourth pattern layer 17d may be spaced apart from each other on the first pattern layer 17a. The second pattern layer 17b' and the fourth pattern layer 17d are differentiated by different cross-hatchings in FIGS. 2A and 2B. The third pattern layer 17c may cover the second pattern layer 17b' and the fourth pattern layer 17d on the first pattern layer 17a. The first pattern layer 17a may have a thickness greater than a thickness of each of the second pattern layer 17b', the third pattern layer 17c, and the fourth pattern layer 17d. The first pattern layer 17a is disposed beneath each of the second, third and fourth pattern layers 17b', 17c and 17d. At least one of the first pattern layer 17a, the second pattern layer 17b', the third pattern layer 17c, and the fourth pattern layer 17d may include a silicon layer. For example, the first pattern layer 17a, the second pattern layer 17b', and the third pattern layer 17c may include a silicon layer, such as a silicon layer having N-type conductivity, and the fourth pattern layer 17d may include a material different from that of the silicon layer. For example, the fourth pattern layer 17d may include a plurality of layers stacked in order, such as a silicon oxide layer, a silicon nitride layer, and a silicon oxide layer stacked in order.

In an example, the first structure 3 may include a semiconductor substrate 4, a peripheral circuit 8 on the semiconductor substrate 4, and a lower insulating layer 13 covering the peripheral circuit 8 on the semiconductor substrate 4. The peripheral circuit 8 may include a circuit device 9 such as a transistor, which may include a peripheral gate 9a and a peripheral source/drain 9b, and a circuit interconnection 11 electrically connected to the circuit device 9. A portion of the circuit interconnection 11 may include peripheral circuit pads 11p1 and 11p2. The pattern structure 17' may be disposed on the lower insulating layer 13.

In an example, the pattern structure 17' may further include a ground pattern 18. For example, the ground pattern 18 may be disposed below the first pattern layer 17a and may be grounded to the semiconductor substrate 4 through a portion of the circuit interconnection 11. For example, the ground pattern 18 may be connected to the circuit interconnection 11 through an opening in the lower insulating layer 13. The ground pattern 18 may have a shape extending from the first pattern layer 17a. For example, when the first pattern layer 17a is formed of a silicon layer, the ground pattern 18 may be formed of a silicon layer extending from the silicon layer.

In an example, the pattern structure 17' may have gaps 17g. Each of the gaps 17g may be a slit or an opening penetrating the pattern structure 17'.

In an example, the first structure 3 may include an internal intermediate insulating layer 19a filling the gaps 17g and an external intermediate insulating layer 19b disposed on an external side of the pattern structure 17'.

In an example, the second structure 21 may include a memory cell array region MCA and a staircase region SA. The second structure 21 may include stack structures 23' and 35' disposed in the memory cell array region MCA and extending from the memory cell array region MCA into the staircase region SA.

In an example, the stack structures 23' and 35' may include a first stack structure 23' and a second stack structure 35' on the first stack structure 23'. The first stack structure 23' may include first interlayer insulating layers 25 and first gate layers 27g alternately stacked in the vertical direction Z. The vertical direction Z may be perpendicular to the upper surface of the pattern structure 17'. The first gate layers 27g may have first gate pads 27p arranged in a staircase shape in the staircase region SA.

In an example, the second stack structure 35' may include second interlayer insulating layers 38 and second gate layers 40g alternately stacked in the vertical direction Z. The second gate layers 40g may have second gate pads 40P arranged in a staircase shape in the staircase region SA.

The first interlayer insulating layers 25 and the second interlayer insulating layers 38 may form the interlayer insulating layers 25 and 38, and the first gate layers 27g and the second gate layers 40g may form the gate layers 27g and 40g. Accordingly, the stack structures 23' and 35' may include the interlayer insulating layers 25 and 38 and the gate layers 27g and 40g alternately stacked in the vertical direction Z. The gate layers 27g and 40g may have the first and second gate pads 27P and 40P arranged in a staircase shape in the staircase region SA.

In example embodiments of the present disclosure, the "gate pad" may be a region of a gate layer not covered by another gate layer in the staircase region SA.

In example embodiments of the present disclosure, the first and second gate pads 27P and 40P may be arranged in various staircase shapes in addition to the staircase shape illustrated in the drawings.

In an example, each of the first and second gate pads 27P and 40P may have a thickness greater than a thickness of each of the first and second gate layers 27g and 40g disposed in the memory cell array region MCA. For example, the first gate pad 27P may be a thick portion at the end of the first gate layer 27g.

In an example, each of the first and second gate layers 27g and 40g may include a conductive material. For example, each of the first and second gate layers 27g and 40g may be formed of one or more of doped polysilicon, a metal-semiconductor compound (e.g., TiSi, TaSi, CoSi, NiSi, WSi, or the like), metal nitride (e.g., TiN, TaN, WN, or the like) or a metal (e.g., Ti, W, or the like). The first and second interlayer insulating layers 25 and 38 may be formed of an insulating material such as silicon oxide.

In an example, the first and second stack structures 23' and 35' may further include one or a plurality of through regions TA. Each of the through regions TA may further include insulating horizontal layers 27i and 40i disposed on the same level as a level of first and second gate layers 27g and 40g adjacent to the through regions TA among the first and second gate layers 27g and 40g. For example, among the through regions TA, a portion of the through region TA adjacent to the first gate layers 27g may include first insulating horizontal layers 27i disposed on the same level as a level of the first gate layers 27g. A portion of the through region TA adjacent to the second gate layers 40g may include second insulating horizontal layers 40i disposed on the same level as a level of the second gate layers 40g.

In an example, each of the through regions TA may further include reinforcing horizontal layers 28 and 41 in contact with and on an uppermost insulating horizontal layer of the insulating horizontal layers 27i and 40i. For example, the through region TA in a position spaced apart from the second stack structure 35' may include a first reinforcing horizontal layer 28 in contact with the uppermost first insulating horizontal layer among the first insulating horizontal layers 27i, and the through region TA disposed in or between the first and second stack structures 23' and 35' may include a second reinforcing horizontal layer 41 in contact with an uppermost second insulating horizontal layer among the second insulating horizontal layers 40i.

In an example, the first and second insulating horizontal layers 27i and 40i may be formed of an insulating material different from that of the first and second interlayer insulating layers 25 and 38. For example, the first and second insulating horizontal layers 27i and 40i may be formed of first silicon nitride, and the first and second interlayer insulating layers 25 and 38 may be formed of silicon oxide.

In an example, the first and second reinforcing horizontal layers 28 and 41 may be formed of second silicon having an etching rate different from that of the first silicon nitride of the first and second insulating horizontal layers 27i and 40i. The second silicon nitride may be a material having an etching rate higher than that of the first silicon nitride.

When viewed on a plane as in FIG. 1, in the first and second stack structures 23' and 35', each of the through regions TA may be surrounded by a gate region GA (in FIG. 1). The first and second gate layers 27g and 40g may be disposed in the gate region GA. Accordingly, each of the through regions TA may be surrounded by adjacent first and second gate layers 27g and 40g.

In an example, the second structure 21 may further include capping insulating layers 32 and 44. The capping insulating layers 32 and 44 may include a first capping insulating layer 32 and a second capping insulating layer 44. The first capping insulating layer 32 may cover the first gate pads 27P, a portion of the pattern structure 17' not covered by the first stack structure 23', and the external intermediate insulating layer 19b. The second capping insulating layer 44 may cover the second gate pads 40P and the first capping insulating layer 32. The first and second capping insulating layers 32 and 14 may be formed of an insulating material such as silicon oxide.

The semiconductor device 1 according to an example embodiment of the present disclosure may further include a memory vertical structure 47 penetrating the second structure 21'. The memory vertical structure 47 may include portions penetrating the first and second stack structures 23' and 35' in the memory cell array region MCA. The memory vertical structure 47 may extend into the pattern structure 17 from a portion penetrating the second structure 21 and may be in contact with the pattern structure 17'. For example, the memory vertical structure 47 may penetrate the third pattern layer 17c and the second pattern layer 17b' and may extend into the first pattern layer 17a. The memory vertical structure 47 may be in contact with at least one of the first to third pattern layers 17a, 17b', and 17c, which may be formed of a silicon layer. Accordingly, the memory vertical structure 47 may be in contact with at least one silicon layer of the pattern structure 17'.

The semiconductor device 1 according to an example embodiment of the present disclosure may further include a string separation pattern 45 penetrating one or more of a plurality of upper gate layers disposed in an upper portion among the second gate layers 40g. The string separation pattern 45 may be formed of silicon oxide.

The semiconductor device 1 according to an example embodiment of the present disclosure may further include a dummy vertical structure 47d penetrating the string separation pattern 45 and also penetrating the second structure 21', and in contact with the pattern structure 17'. The dummy vertical structure 47d may have the same cross-sectional structure as that of the memory vertical structure 47 and may be formed of the same material as that of the memory vertical structure 47.

The semiconductor device 1 according to an example embodiment of the present disclosure may further include a first upper insulating layer 58 on the second structure 21'. The first upper insulating layer 58 may include silicon oxide.

The semiconductor device 1 according to an example embodiment of the present disclosure may further include support vertical structures 62 penetrating the first upper insulating layer 58 and the second structure 21' and in contact with the pattern structure 17. At least a plurality of the support vertical structures 62 may penetrate the third pattern layer 17c and the fourth pattern layer 17d of the pattern structure 17 in order and may extend into the first pattern layer 17a. One of the support vertical structures 62 may be spaced apart from the fourth pattern layer 17d, may penetrate the third pattern layer 17c, and may extend into the first pattern layer 17a. The support vertical structure 62 spaced apart from the fourth pattern layer 17d may also be spaced apart from the second pattern layer 17b' such that it is disposed between the second and fourth pattern layers 17b' and 17d.

A plurality of the support vertical structures 62 may be disposed, but for ease of description, a single support vertical structure will be described.

An upper surface of the support vertical structure 62 may be disposed on a level higher than a level of an upper surface of the memory vertical structure 47.

In example embodiments of the present disclosure, the "level" may refer to a level when viewed with respect to the upper surface of the pattern structure 17.

In an example, the support vertical structure 62 may include silicon oxide or silicon oxide having voids formed therein.

The semiconductor device 1 according to an example embodiment of the present disclosure may further include peripheral contact plugs 61a, 61b, and 61c. The peripheral contact plugs 61a, 61b, and 61c may include a first peripheral contact plug 61a, a second peripheral contact plug 61b, and a third peripheral contact plug 61c.

In an example, the first peripheral contact plug 61a may penetrate the first upper insulating layer 58 and the second structure 21', and may be in contact with the pattern structure 17'. The first peripheral contact plug 61a may penetrate the first and second capping insulating layers 32 and 44 of the second structure 21', and may be spaced apart from the first and second stack structures 23' and 35' of the second structure 21'.

In an example, in the pattern structure 17', the first pattern layer 17a formed of a polysilicon layer having N-type conductivity may be a common source region, and the first peripheral contact plug 61a may be a common source contact plug electrically connected to the common source region. In other words, the first peripheral contact plug 61 may be in direct contact with the first pattern layer 17a.

In an example, the second peripheral contact plug 61b may penetrate the first upper insulating layer 58, the second structure 21', and the internal intermediate insulating layer 19a, may extend downwardly, and may be in contact with the first peripheral circuit pad 11p1. The second peripheral contact plug 61b may penetrate at least one of the first and second capping insulating layers 32 and 44 of the second structure 21', and may penetrate the through region TA of the first and second stack structures 23' and 35'. Accordingly, the second peripheral contact plug 61b may include a portion penetrating the first and second insulating horizontal layers 27i and 40i of the through region TA.

In an example, the third peripheral contact plug 61c may penetrate the first upper insulating layer 58, the first and second capping insulating layers 32 and 44 of the second structure 21', and the external intermediate insulating layer 19b, may extend downwardly, and may be in contact with the second peripheral circuit pad 11p2.

The first to third peripheral contact plugs 61a, 61b, and 61c may be spaced apart from the first and second gate layers 27g and 40g of the first and second stack structures 23' and 35'. In other words, the first to third peripheral contact plugs 61a, 61b, and 61c may not contact the first and second gate layers 27g and 40g.

Upper surfaces of the first to third peripheral contact plugs 61a, 61b, and 61c may be disposed on substantially the same level as a level of the upper surface of the support vertical structure 62. The first to third peripheral contact plugs 61a, 61b, and 61c, and upper surfaces of the support vertical structure 62 may be disposed on a level higher than a level of the memory vertical structure 47. For example, the upper surfaces of the first to third peripheral contact plugs 61a, 61b, and 61c may be at the same level as a level of the upper surface of the first upper insulating layer 58.

A second upper insulating layer 64 may be disposed on the first upper insulating layer 58. The second upper insulating layer 64 may include silicon oxide.

The semiconductor device 1 according to an example embodiment of the present disclosure may include separation structures 68 penetrating the second upper insulating layer 64, the first upper insulating layer 58, and the second structure 21'. Each of the separation structures 68 may be formed of silicon oxide or silicon oxide having voids formed therein. The separation structures 68 may include a plurality of main separation structures 68M parallel to each other, and auxiliary separation structures 68S disposed between the main separation structures 68M. Each of the separation structures 68 may include a line portion extending in the first horizontal direction X (see FIG. 1). The first horizontal direction X may be parallel to the upper surface of the pattern structure 17'. The first horizontal direction X may be a direction from the memory cell array region MCA toward the staircase region SA. Each of the auxiliary separation structures 68S may have a shorter length than that of each of the main separation structures 68M. The main separation structures 68M may penetrate the second structure 21 and may separate the first and second stack structures 23' and 35' in the second horizontal direction Y. The second horizontal direction Y may be parallel to the upper surface of the pattern structure 17' and may be perpendicular to the first horizontal direction X.

Upper surfaces of the separation structures 68 may be disposed on a level higher than levels of the first to third peripheral contact plugs 61a, 61b, and 61c and the upper surfaces of the support vertical structure 62.

Each of the separation structures 68 may be in contact with the first and second gate layers 27g and 40g adjacent to the separation structure 68.

In an example, the separation structures 68 may include separation protrusions 68p protruding in a direction toward the first and second gate layers 27g and 40g adjacent to the separation structure 68. In the separation structures 68, a width of a portion in which the separation protrusions 68p are disposed may be greater than a width of a portion adjacent to the separation protrusions 68p in the vertical direction Z.

In an example, the separation structures 68 may extend downwardly from a portion penetrating the second structure 21' and may be in contact with the pattern structure 17'. At least one of the separation structures 68 may be in contact with the first pattern layer 17a. For example, the at least one separation structure 68 may penetrate the third, fourth and first pattern layers 17c, 17d and 17a in order.

The semiconductor device 1 according to an example embodiment of the present disclosure may further include a dielectric layer 67. The dielectric layer 67 may include a high-k dielectric having a dielectric constant higher than that of silicon oxide. For example, the dielectric layer 67 may be formed of a high-k dielectric such as aluminum oxide, lanthanum oxide, or hafnium oxide.

The dielectric layer 67 may include a first dielectric portion 67a (in FIG. 2C) and a second dielectric portion 67b (in FIG. 2C). The first dielectric portion 67a may cover upper and lower surfaces of each of the first and second gate layers 27g and 40g, and may be disposed between each of the first and second gate layers 27g and 40g and the memory vertical structure 47. In addition, the first dielectric portion 67 may be disposed between each of the first and second gate layers 27g and 40g and the support vertical structure 62. The second dielectric portion 67b may extend from the first dielectric portion 67a and may cover a side surface of the separation structure 68 not in contact with the first and second gate layers 27g and 40g.

In an example, a lower end of the support vertical structure 62 may be disposed on a level different from a level of a lower end of the separation structure 68 adjacent to the support vertical structure 62. For example, the lower end of the support vertical structure 62 may be disposed on a level lower than a level of the lower end of the separation structure 68. The lower end of the support vertical structure 62 may be in contact with the first pattern layer 17a. The lower end of the separation structure 68 may be separated from the first pattern layer 17a by the second dielectric portion 67b.

The semiconductor device 1 according to an example embodiment of the present disclosure may further include a third upper insulating layer 72 disposed on the second upper insulating layer 64. The third upper insulating layer 72 may include silicon oxide.

The semiconductor device 1 according to an example embodiment of the present disclosure may further include gate contact plugs 75 penetrating the first to third upper insulating layers 58, 64, and 72, extending downwardly, and in contact with the second gate pads 40p. The upper surfaces of the gate contact plugs 75 may be disposed on a level higher than a level of the upper surfaces of the separation structures 68.

The semiconductor device 1 according to an example embodiment of the present disclosure may further include a fourth upper insulating layer 78 disposed on the third upper insulating layer 72. The fourth upper insulating layer 78 may include silicon oxide.

The semiconductor device 1 according to an example embodiment of the present disclosure may further include a bit line contact plug 81b penetrating the first to fourth upper insulating layers 58, 64, 72, and 78 and electrically connected to the memory vertical structure 47.

In an example, the bit line contact plug 81b may include a side surface not vertically aligned with a side surface of the memory vertical structure 47.

The semiconductor device 1 according to an example embodiment of the present disclosure may further include peripheral upper plugs 81s, 81p1, and 81p2 penetrating the second to fourth upper insulating layers 64, 72, and 78. The peripheral upper plugs 81s, 81p1, and 81p2 may further include a first peripheral upper plug 81s electrically connected to the first peripheral contact plug 61a, a second peripheral upper plug 81p1 electrically connected to the second peripheral contact plug 61b, and a third peripheral upper plug 81p2 electrically connected to the third peripheral contact plug 61c.

In an example, the first peripheral upper plug 81s may include a side surface not vertically aligned with a side surface of the first peripheral contact plug 61a. In other words, the bottom surface of the first peripheral upper plug 81a may be narrower than the upper surface of the first peripheral contact plug 61a.

In an example, the second peripheral upper plug 81p1 may include a side surface not vertically aligned with a side surface of the second peripheral contact plug 61b.

In an example, the third peripheral upper plug 81p2 may include a side surface not vertically aligned with a side surface of the third peripheral contact plug 61c.

The semiconductor device 1 according to an example embodiment of the present disclosure further may include gate upper plugs 81g penetrating the fourth upper insulating layer 78 and electrically connected to the gate contact plugs 75.

In an example, the gate contact plugs 75 and the gate upper plugs 81g may include a first gate contact plug and a first gate upper plug in contact with each other, and the first gate contact plug may include a side surface not vertically aligned with a side surface of the first gate upper plug.

The semiconductor device 1 according to an example embodiment of the present disclosure may further include interconnection lines 84b, 84g, 84s, and 84p disposed on the fourth upper insulating layer 78. The interconnection lines 84b, 84g, and 84p may include bit lines 84b electrically connected to the bit line contact plugs 81b, gate interconnection lines 84g electrically connecting each of the gate upper plugs 81g to a plurality of the second peripheral upper plugs 81p1, a first peripheral interconnection line 84s electrically connected to the first peripheral upper plug 81s, and a second peripheral interconnection line 84p electrically connected to the third peripheral upper plug 81p2.

In the above-described example embodiment, each of the separation structures 68 may include a line portion extending in the first horizontal direction X from the memory cell array region MCA toward the staircase region SA.

In the above-described example embodiment, an upper surface of the memory vertical structure 47 may be disposed on a first level, an upper surface of the first peripheral contact plug 61a may be disposed on a second level, upper surfaces of the separation structures 68 may be disposed on a third level, and upper surfaces of the gate contact plugs 75 may be disposed on a fourth level. The upper surface of the support vertical structure 62 may be disposed on the second level. The first to fourth levels may be different. In an example, the second level may be higher than the first level, the third level may be higher than the second level, and the fourth level may be higher than the third level.

Figure 3:
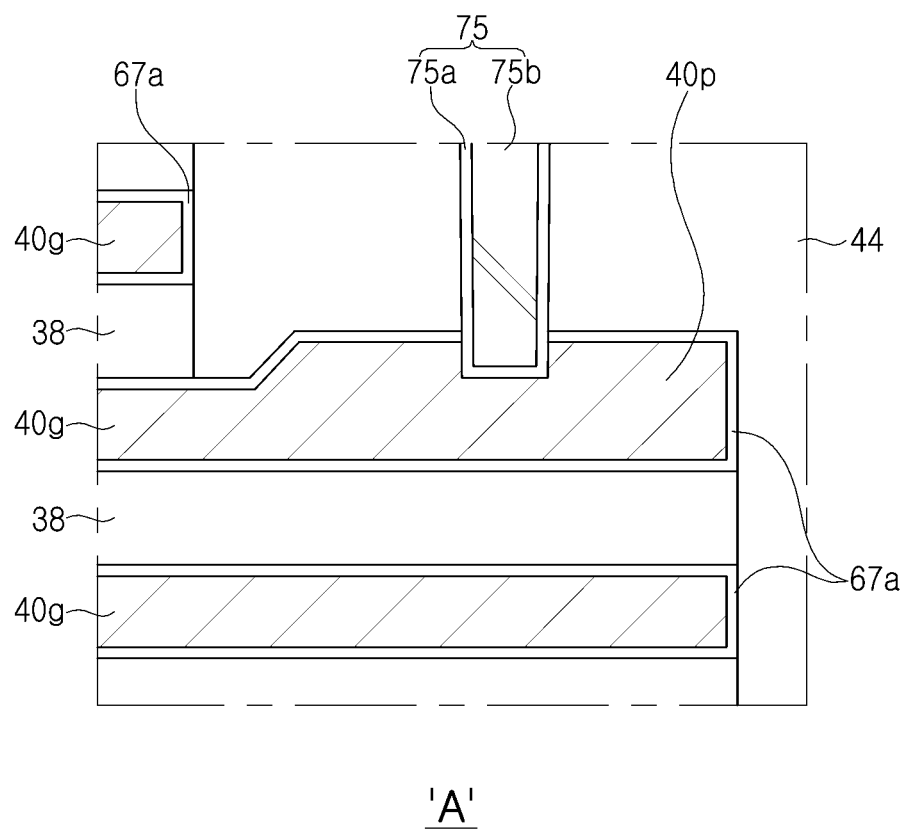
FIGS. 3, 4, and 5 are enlarged cross-sectional diagrams illustrating portions of a semiconductor device according to an example embodiment of the present disclosure.

In the description below, an example of the gate contact plugs 75 will be described with reference to FIG. 3. FIG. 3 is an enlarged diagram illustrating portion "A" in FIG. 2A.

Referring to FIG. 3, each of the gate contact plugs 75 may include a plug pattern 75b and a liner layer 75a covering side and bottom surfaces of the plug pattern 75b. The liner layer 75a may include at least one of a metal material such as Ti and metal nitride such as TiN. The plug pattern 75b may include a metal material such as tungsten.

Figure 4:
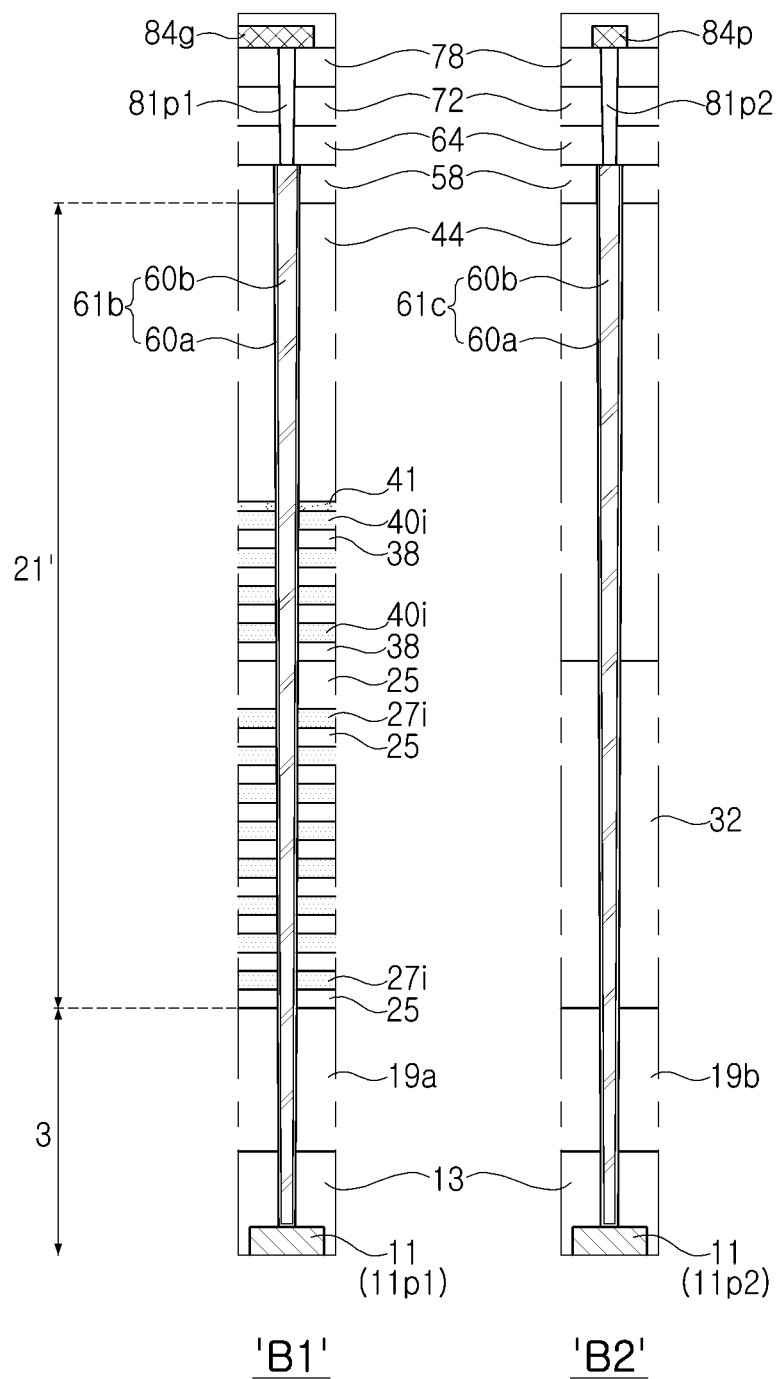

In the description below, an example of the second and third peripheral contact plugs 61b and 61c will be described with reference to FIG. 4. FIG. 4 is an enlarged diagram illustrating portions "B1" and "B2" in FIG. 2A, respectively.

Referring to FIG. 4, each of the second and third peripheral contact plugs 61b and 61c may include a plug pattern 60b and a liner layer 60a covering side and bottom surfaces of the plug pattern 60b. The liner layer 60a may include at least one of a metal material such as Ti and metal nitride such as TiN. The plug pattern 60b may include a metal material such as tungsten. The first peripheral contact plug 61a may include the same material as that of the second and third peripheral contact plugs 61b and 61c, such as the liner layer 60a and the plug pattern 60b, for example.

Figure 5:
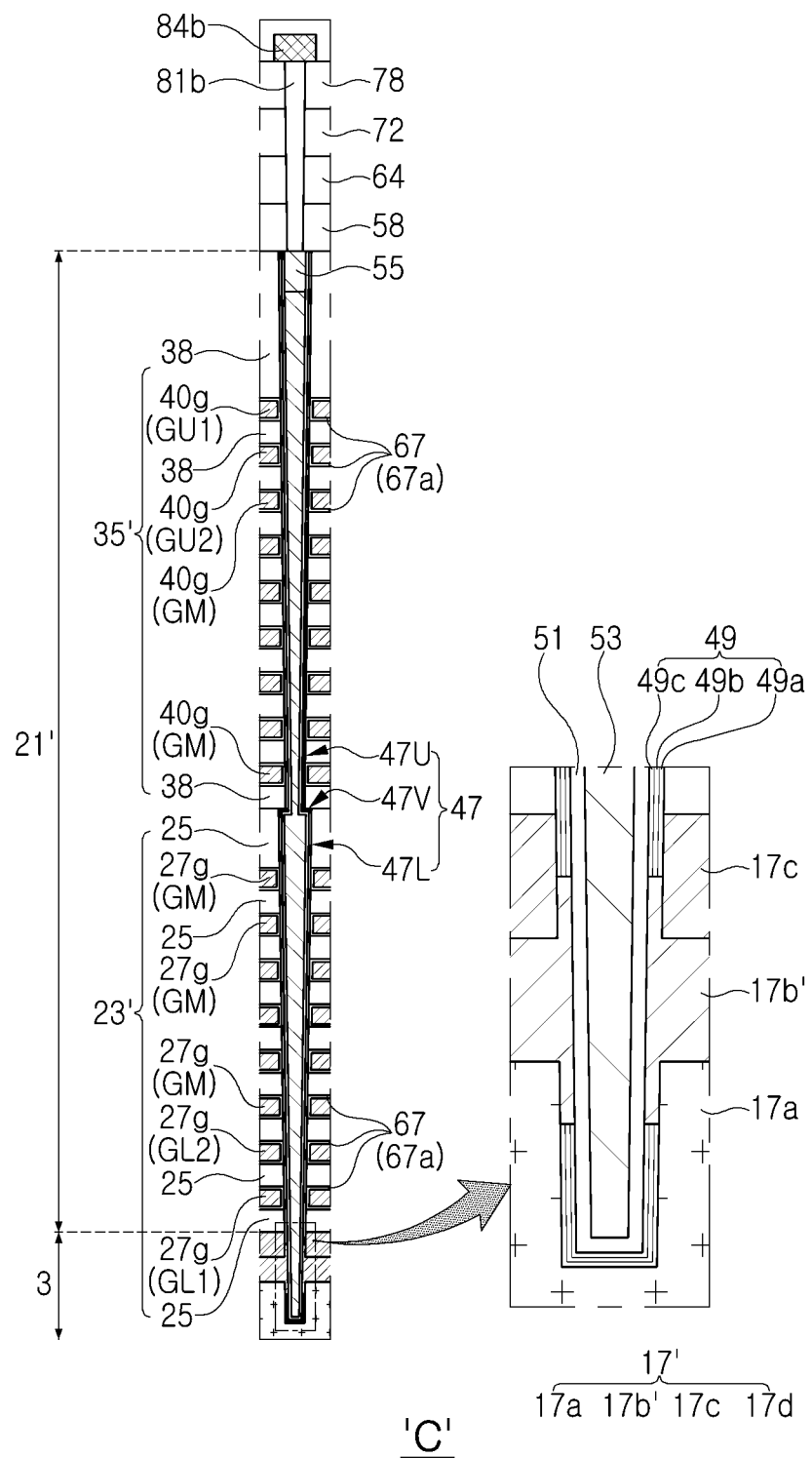

In the description below, examples of the first and second gate layers 27g and 40g and the memory vertical structure 47 will be described with reference to FIG. 5. FIG. 5 is an enlarged diagram illustrating portion "C" in FIG. 2A.

Referring to FIG. 5, the first and second gate layers 27g and 40g include one or more lower gate layers GL1 and GL2, the one or more upper gate layers GU1 and GU2, and a plurality of intermediate gate layers GM disposed between the one or more lower gate layers GL1 and GL2 and the one or more upper gate layers GU1 and GU2. In an example, the one or more upper gate layers GU1 and GU2 may be configured as a plurality of the upper gate layers GU1 and GU2 spaced apart from each other in the vertical direction Z. For example, the plurality of upper gate layers GU1 and GU2 may include a first upper gate layer GU1 and a second upper gate layer GU2 disposed below the first upper gate layer GU1.

In an example, the one or more lower gate layers GL1 and GL2 may be configured as a plurality of the lower gate layers GL1 and GL2 spaced apart from each other in the vertical direction Z. For example, the plurality of lower gate layers GL1 and GL2 may include a first lower gate layer GL1 and a second lower gate layer GL2 disposed on the first lower gate layer GL1.

In an example, a portion of the plurality of intermediate gate layers GM may be word lines.

In an example, the first lower gate layer GL1 may be a ground select gate line of a ground select transistor, and the second lower gate layer GL2 may be a dummy gate line. In another example, the first lower gate layer GL1 may be an erase control gate line of an erase control transistor used in an erase operation for erasing data stored in memory cells using gate induce drain leakage (GIDL), and the second lower gate layer GL2 may be a ground select gate line of a ground select transistor.

In an example, the plurality of upper gate layers GU1 and GU2 may be string select gate lines of string select transistors. In another example, among the plurality of upper gate layers GU1 and GU2, the first upper gate layer GU1 may be an erase control gate line of an erase control transistor, and the second upper gate layer GU2 may be a string select gate line of a string select transistor.

The memory vertical structure 47 may include a lower vertical portion 47L penetrating the first stack structure 23' and an upper vertical portion 47U penetrating the second stack structure 35'.

In an example, a width of an upper region of the lower vertical portion 47L may be different from a width of a lower region of the upper vertical portion 47U. For example, the width of the upper region of the lower vertical portion 47L may be larger than the width of the lower region of the upper vertical portion 47U. In another example, a width of an upper region of the upper vertical portion 47U may be equal to the width of the upper region of the lower vertical portion 47L.

In an example, a side surface of the lower vertical portion 47L adjacent to each other and a side surface of the upper vertical portion 47U may not be aligned in the vertical direction Z.

In an example, a middle side surface of the memory vertical structure 47 disposed on a level between an uppermost first gate layer among the first gate layers 27g of the first stack structure 23' and a lowermost second gate layer among the second gate layers 40g of the second stack structure 35' may include a bent portion 47V. The bent portion 47V may correspond to a portion of the memory vertical structure 47 where the lower vertical portion 47L and the upper vertical portion 47U meet.

On the same level as a level of the bent portion 47V of the middle side surface of the memory vertical structure 47, side surfaces of each of the separation structures 68 described above may have a substantially linear shape, and side surfaces of each of the peripheral contact plugs 61a, 61b, and 61c may have a substantially linear shape.

The memory vertical structure 47 may include an insulating gap-fill layer 53, a channel layer 51 covering an external side surface and a bottom surface of the insulating gap-fill layer 53, a data storage structure 49 covering an external side surface and a bottom surface of the channel layer 51, and a pad material layer 55 on the insulating gap-fill layer 53.

The data storage structure 49 may include a first dielectric layer 49c covering an external side surface and a bottom surface of the channel layer 51, a data storage material layer 49b covering an external side surface and a bottom surface of the first dielectric layer 49c, and a second dielectric layer 49a covering an external side surface and a bottom surface of the data storage material layer 49b. The first dielectric layer 49c may be in contact with the channel layer 51, and the data storage material layer 49b may be spaced apart from the channel layer 51. The insulating gap-fill layer 53 may include silicon oxide, such as silicon oxide formed by an atomic layer deposition process, for example, or silicon oxide having voids formed therein. The first dielectric layer 49c may include silicon oxide or silicon oxide doped with impurities. The second dielectric layer 49a may include at least one of silicon oxide and a high-k dielectric. The data storage material layer 49b may include a material for storing data by trapping charges, such as silicon nitride, for example.

The data storage material layer 49b of the data storage structure 49 of the memory vertical structure 47 may include regions for storing data in a semiconductor device such as a flash memory device. The channel layer 51 may include polysilicon. The pad material layer 55 may include at least one of doped polysilicon, metal nitride (e.g., TiN, or the like), a metal (e.g., W, or the like), and a metal-semiconductor compound (e.g., TiSi, or the like).

The memory vertical structure 47 may penetrate the third pattern layer 17c and the second pattern layer 17b' of the pattern structure 17' in order, and may extend into the first pattern layer 17a. In the pattern structure 17', the second pattern layer 17b' may penetrate the data storage structure 49 and may be in contact with the channel layer 51. For example, the second pattern layer 17b' may extend along a sidewall formed by the first pattern layer 17a and the third pattern layer 17c.

In an example embodiment of the present disclosure, the support vertical structure 62 (in FIGS. 2B and 2C) may not include a material of the channel layer 51 of the memory vertical structure 47. In an example embodiment of the present disclosure, the support vertical structure 62 (in FIGS. 2B and 2C) may be formed of an insulating material, such as silicon oxide, for example.

Figure 6:
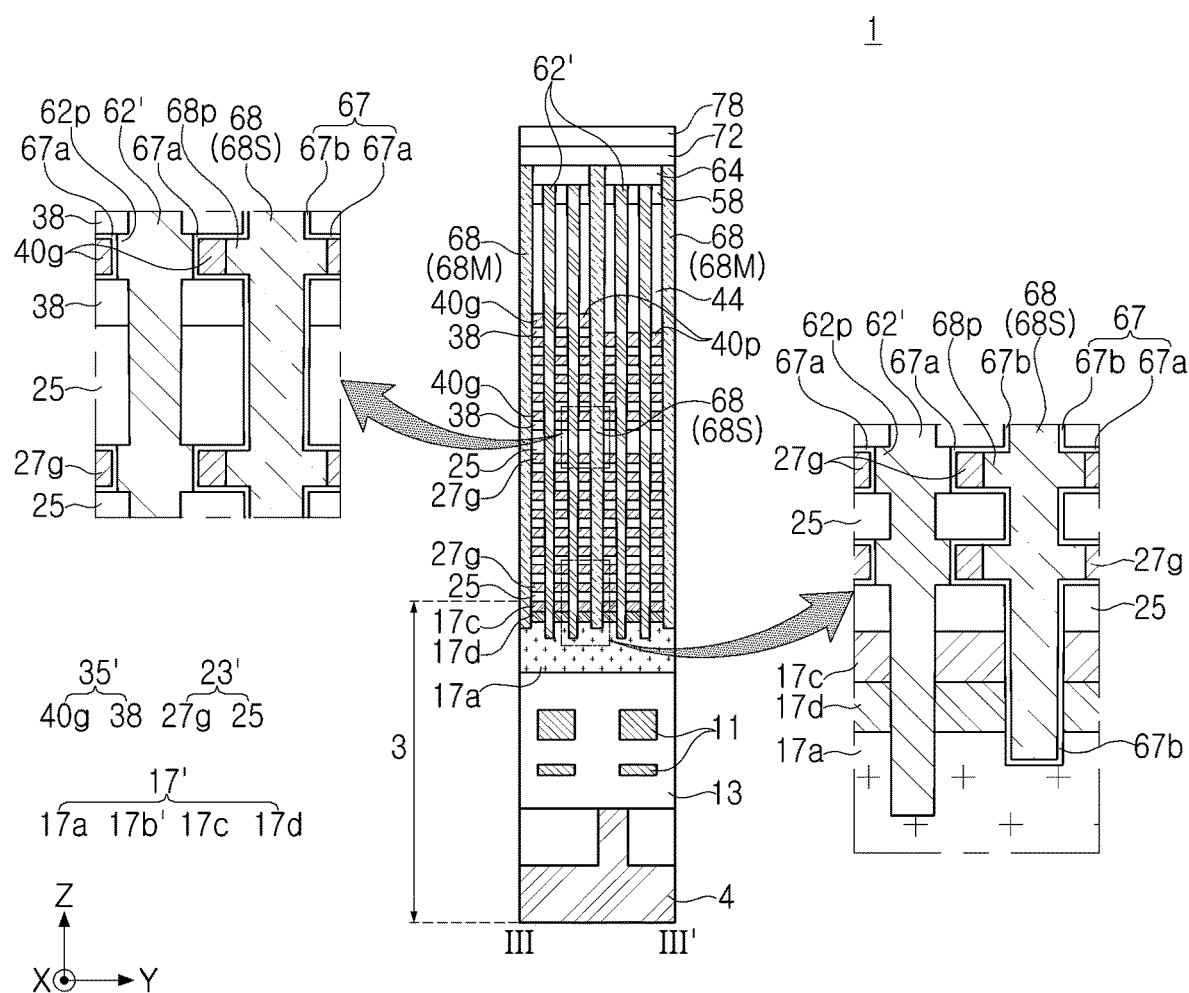
FIG. 6 is a cross-sectional diagram illustrating a modified example of a semiconductor device according to an example embodiment of the present disclosure.

In the description below, a modified example of the support vertical structure 62 will be described with reference to FIG. 6. FIG. 6 is a cross-sectional diagram illustrating a modified example of the support vertical structure 62 in the cross-sectional structure in FIG. 2C.

In the modified example, referring to FIG. 6, a support vertical structure 62' in the modified example may include support protrusions 62p extending in a direction toward first and second gate layers 27g and 40g adjacent to the support vertical structure 62' among the first and second gate layers 27g and 40g.

In the support vertical structure 62', a width of a portion in which the support protrusions 62p are disposed may be greater than a width of a portion adjacent to the support protrusions 62p in the vertical direction Z.

The first and second gate layers 27g and 40g may be disposed between one of the support structures 62' and one of the separation structures 68 adjacent to each other.

In the support vertical structure 62', when viewed from a side surface of the support vertical structure 62' in contact with the first and second interlayer insulating layers 25 and 38, the support protrusions 62p may protrude by a first distance. In the separation structure 68, when viewed from a side surface of the separation structure 68 opposing the first and second interlayer insulating layers 25 and 38, the separation protrusions 68p may protrude by a second distance greater than the first distance. Accordingly, a width of one of the separating protrusions 68p may be greater than a width of one of the support protrusions 62p.

Figure 7:
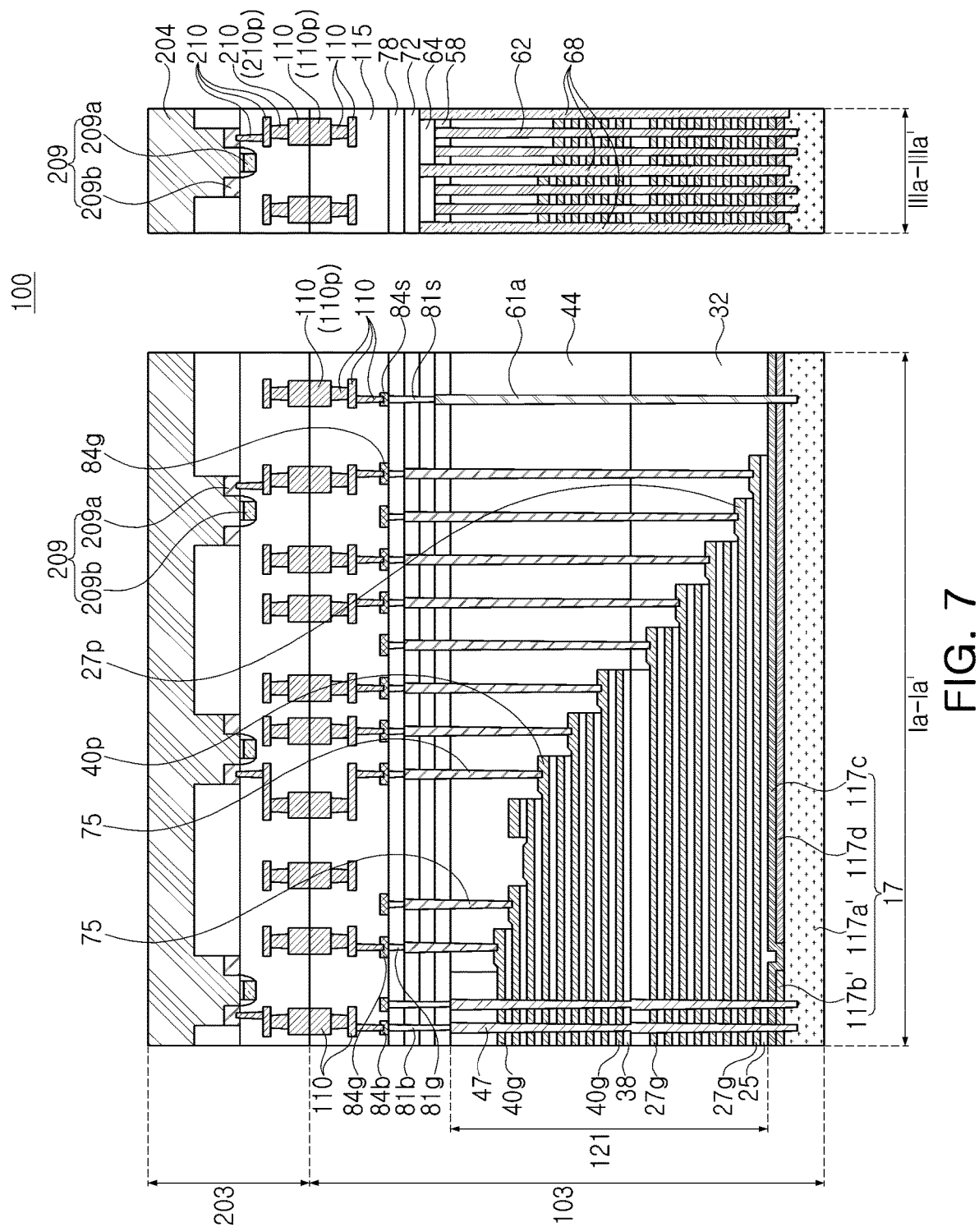
FIG. 7 is a cross-sectional diagram illustrating a modified example of a semiconductor device according to an example embodiment of the present disclosure.

In the description below, an example of a semiconductor device in a modified example will be described with reference to FIG. 7. In FIG. 7, the region taken along line Ia-Ia' may be a cross-sectional region taken in a first horizontal direction, and the region taken along line IIIa-IIIa' may be a cross-sectional region taken in a second horizontal direction perpendicular to the first horizontal direction.

Referring to FIG. 7, the semiconductor device 100 according to the modified embodiment may include a lower structure 103 and an upper structure 203 overlapping in a vertical direction. The lower structure 103 may be a memory semiconductor chip, and the upper structure 203 may be a logic semiconductor chip.

The lower structure 103 may include a pattern structure 117 and a structure 121 on the pattern structure 117. The pattern structure 117 may include first to fourth pattern layers 117a-117d corresponding to the first to fourth pattern layers 17a-17d, respectively, described with reference to FIGS. 1 to 2C.

The structure 121 may have substantially the same structure as that of the portion of the second structure 21' other than the through regions TA, described with reference to FIGS. 1 to 2C. For example, the structure 121 may include a stack structure including gate layers 27g and 40g and interlayer insulating layers 25 and 38 alternately stacked. The gate layers 27g and 40g may include substantially the same gate pads 27p and 40p described with reference to FIGS. 1 to 2C. The structure 121 may include the first and second capping insulating layers 32 and 44 described with reference to FIGS. 1 to 2C.

The lower structure 103 may further include the first to fourth upper insulating layers 58, 64, 72, and 78 substantially the same as in FIGS. 1 to 2C.

The lower structure 103 may include the separation structures 68, the memory vertical structure 47, the support vertical structures 62, the first peripheral contact plug 61a, the gate contact plugs 75, the bit line contact plug 81b, the gate upper plug 81g, the first peripheral upper plug 81s, and the interconnection lines 84b and 84g, 84s, which may be the same as in FIGS. 1 to 2C.

The lower structure 103 may include a capping insulating structure 115 on the fourth upper insulating layer 78 and a lower bonding wiring interconnection 110 electrically connected to the interconnection lines 84b, 84g, and 84s in the capping insulating structure 115. The lower bonding wiring interconnection 110 may include lower bonding pads 110p.

The upper structure 203 may include a semiconductor substrate 204, a peripheral circuit 209 disposed between the semiconductor substrate 204 and the lower structure 103, and an upper bonding wiring interconnection 210 disposed between the peripheral circuit 209 and the lower structure 103. The upper bonding wiring interconnection 210 may include upper bonding pads 210p. The peripheral circuit 209 may include a peripheral device such as a transistor including a peripheral gate 209a and a peripheral source/drain 209b.

The lower bonding pads 110p of the lower bonding wiring interconnection 110 may be in contact with the upper bonding pads 210p of the upper bonding wiring interconnection 210. The lower bonding pads 110p and the upper bonding pads 210p may include a copper material.

In the description below, an example of a method of manufacturing a semiconductor device according to an example embodiment of the present disclosure will be described with reference to FIGS. 8A to 10C. In FIGS. 8A to 10C, FIGS. 8A and 10A are cross-sectional diagrams illustrating a region taken along line I-I' in FIG. 1, FIGS. 8B, 9A and 10B are cross-sectional diagrams illustrating a region taken along line II-II' in FIG. 1, and FIGS. 8C and 10C are cross-sectional diagrams illustrating a region taken along line III-III' in FIG. 1.

Figure 8A:
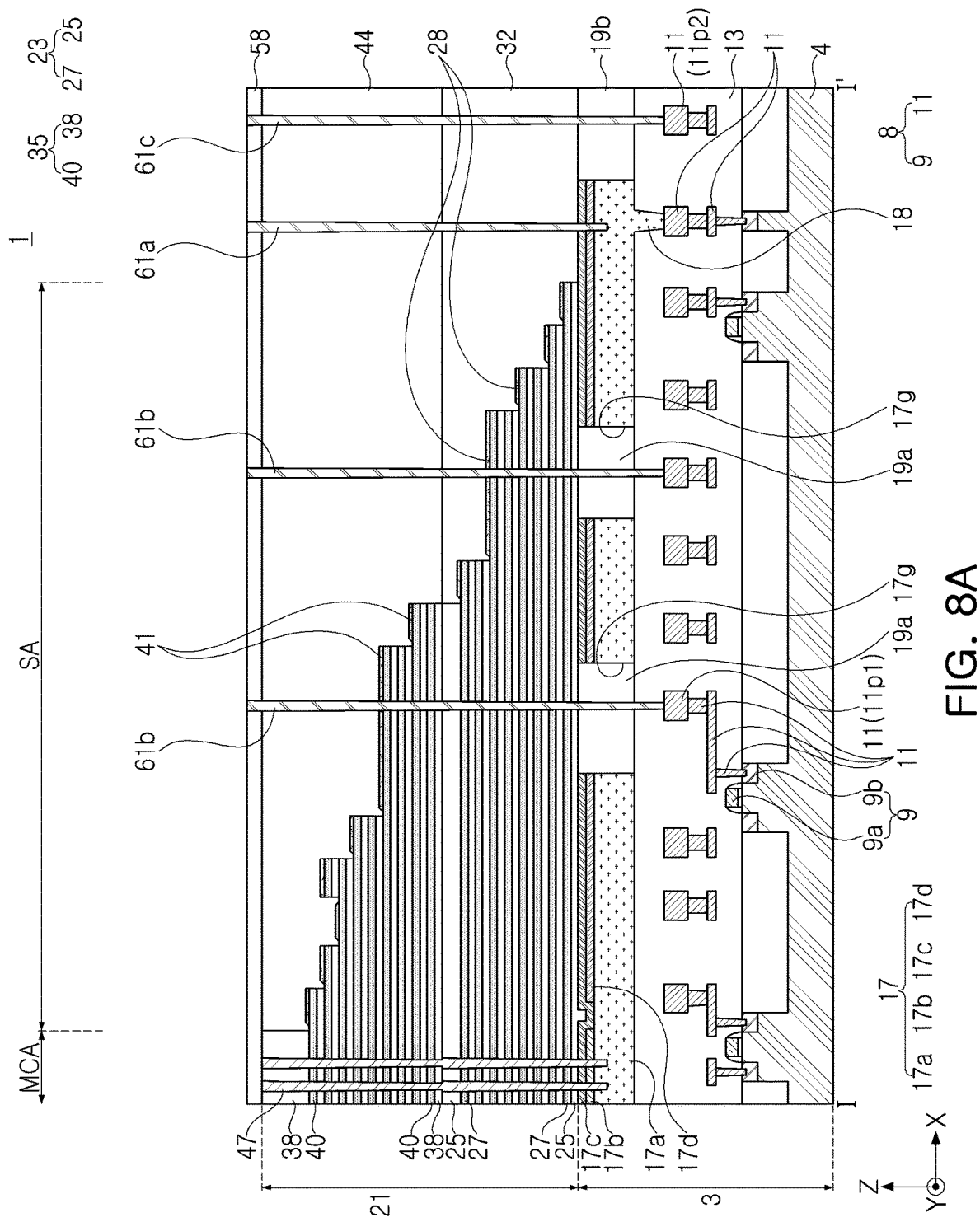
FIGS. 8A, 8B, 8C, 9A, 9B, 10A, 10B and 10C are cross-sectional diagrams illustrating an example of a method of manufacturing a semiconductor device according to an example embodiment of the present disclosure.
Figure 8B:
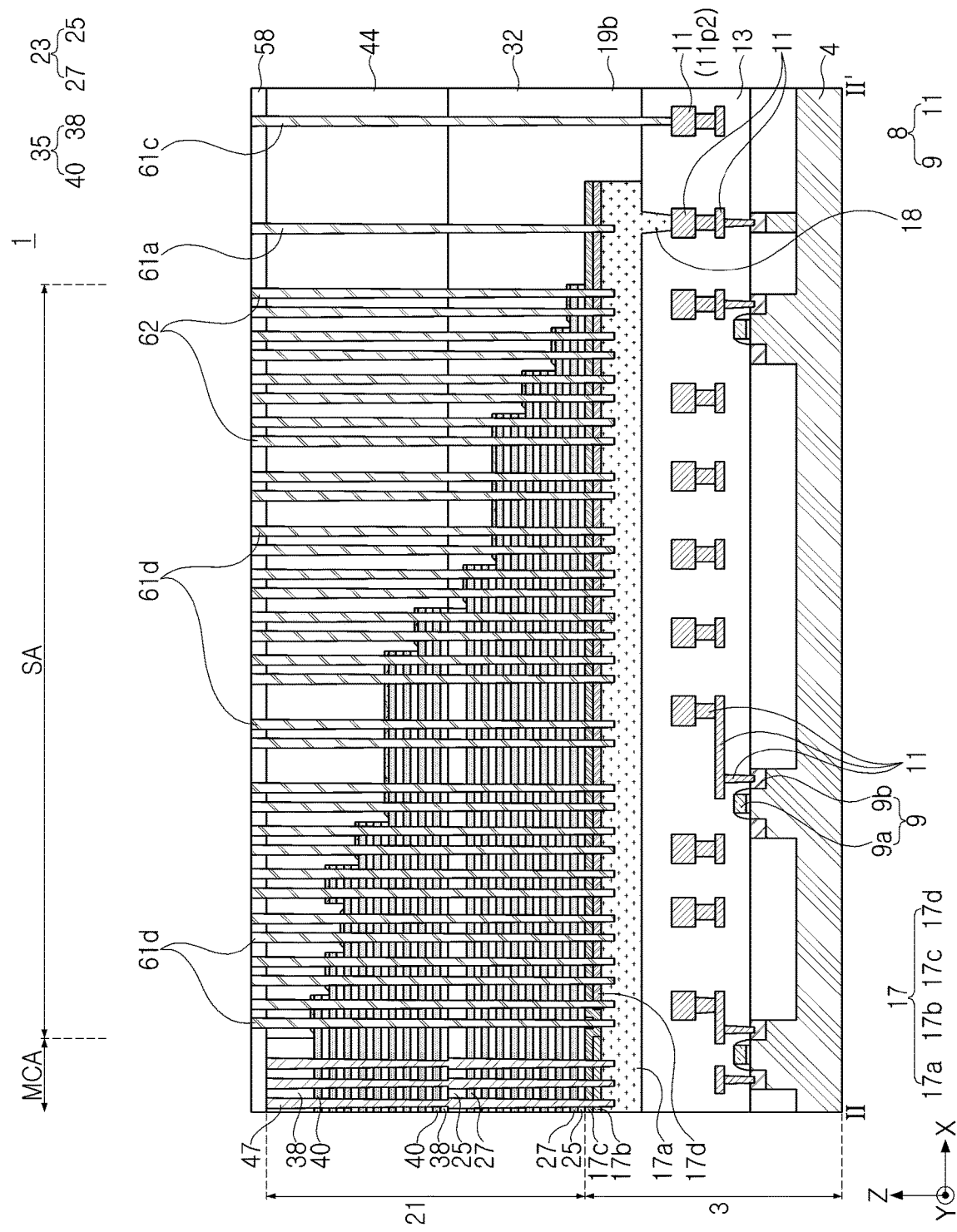
Figure 8C:
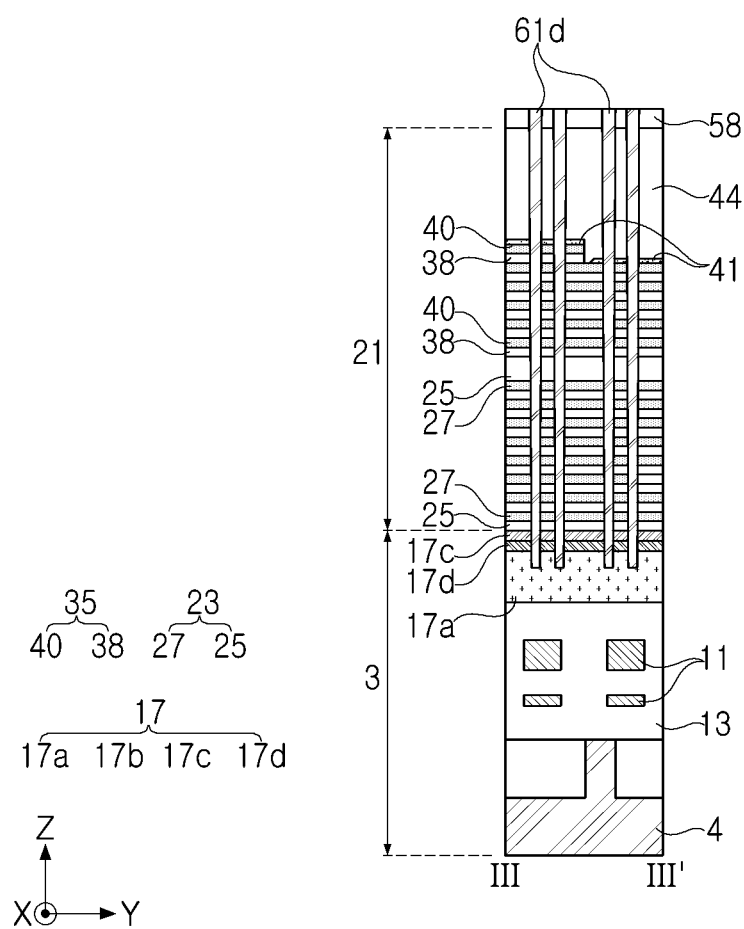

Referring to FIGS. 8A, 8B, and 8C, a first structure 3 may be formed. The forming of the first structure 3 may include forming a peripheral circuit 8 and a lower insulating layer 13 covering the peripheral circuit 8 on a semiconductor substrate 4, forming a preliminary pattern structure 17 having gaps 17g on the lower insulating layer 13, and forming intermediate insulating layers 19a and 19b filling the gaps 17g and disposed on an external side surface of the preliminary pattern structure 17. The peripheral circuit 8 may include a circuit device 9 such as a transistor, which may include a peripheral gate 9a and a peripheral source/drain 9b, and a circuit interconnection 11 electrically connected to the circuit device 9. A portion of the circuit interconnection 11 may include peripheral circuit pads 11p1 and 11p2.

The forming of the preliminary pattern structure 17 may include forming a first pattern layer 17a, forming intermediate pattern layers 17b and 17d spaced apart from each other on the first pattern layer 17a, and forming a third pattern layer 17c covering the intermediate pattern layers 17b and 17d on the first pattern layer 17a. The first and third pattern layers 17a and 17c may be formed of a silicon layer. The intermediate pattern layers 17b and 17d may include a plurality of layers stacked in order, a silicon oxide layer, a silicon nitride layer, and a silicon oxide layer stacked in order, for example.

The intermediate insulating layers 19a and 19b may include an internal intermediate insulating layer 19a filling the gaps 17g and an external intermediate insulating layer 19b formed on an external side surface of the preliminary pattern structure 17.

A second structure 21 may be formed on the first structure 3. The second structure 21 may include preliminary stack structures 23 and 35 including interlayer insulating layers 25 and 38 and horizontal layers 27 and 40 alternately stacked, and capping insulating layers 32 and 44 covering at least a portion of the preliminary stack structures 23 and 35. The horizontal layers 27 and 40 may include pad regions arranged in a staircase shape. For example, the forming of the second structure 21 may include forming the first preliminary stack structure 23 on the preliminary pattern structure 17, forming a first capping insulating layer 32 covering a portion of the first preliminary stack structure 23 and the external intermediate insulating layer 19b, forming a second preliminary stack structure 35 on the first preliminary stack structure 23, and forming a second capping insulating layer 44 covering a portion of the second preliminary stack structure 35 and the first capping insulating layer 32.

The first preliminary stack structure 23 may include first interlayer insulating layers and first horizontal layers 27 alternately stacked. The second preliminary stack structure 35 may include second interlayer insulating layers 40 and second horizontal layers 40 alternately stacked. The first and second interlayer insulating layers 25 and 38 may be formed of silicon oxide, and the first and second horizontal layers 27 and 40 may be formed of silicon nitride.

In an example, on at least one side of the first preliminary stack structure 23, the first horizontal layers 27 may include pad regions arranged in a staircase shape. On at least one side of the second preliminary stack structure 35, the second horizontal layers 40 may include pad regions arranged in a staircase shape. In the second preliminary structure 21, a region in which the pad regions of the first and second horizontal layers 27 and 40 arranged in a staircase shape are disposed may be referred to as a staircase region SA, and a region adjacent to the region adjacent to SA, in which the first and second horizontal layers 27 and 40 are disposed, may be referred to as a memory cell array region MCA.

In an example, before forming the first capping insulating layer 32, first reinforcing horizontal layers 28 may be formed on regions of the first horizontal layers 27 arranged in a staircase shape. Before forming the second capping insulating layer 44, second reinforcing horizontal layers 41 may be formed on the pad regions of the second horizontal layers 40 arranged in a staircase shape. The first and second reinforcing horizontal layers 41 may be formed of silicon nitride.

A memory vertical structure 47 penetrating the memory cell array region MCA of the second preliminary structure 21 and configured to be in contact with the preliminary pattern structure 17 may be formed. The forming of the memory vertical structure 47 may include, before forming the second preliminary stack structure 35, forming a sacrificial vertical portion penetrating the first preliminary stack structure 23, forming the second preliminary stack structure 35, forming an upper channel hole penetrating the second preliminary stack structure 35 and exposing the sacrificial vertical portion, forming a lower channel hole by removing the sacrificial vertical portion exposed by the channel hole, and forming the memory vertical structure 47 in the lower and upper channel holes. The memory vertical structure 47 may include the data storage structure 49 (in FIG. 6), the channel layer 51 (in FIG. 6), the insulating gap-fill layer 53 (in FIG. 6), and the pad material layer 55 (in FIG. 6), described in FIG. 6.

A first upper insulating layer 58 may be formed on the second preliminary structure 21.

Peripheral contact plugs 61a, 61b, and 61c and dummy plugs 61d may be formed simultaneously. For example, the contact plugs 61a, 61b, and 61c and dummy plugs 61d may be formed through openings in the first upper insulating layer 58 and the first and second preliminary pattern structures 3 and 21. The peripheral contact plugs 61a, 61b, and 61c may include a first peripheral contact plug 61a, a second peripheral contact plug 61b, and a third peripheral contact plug 61c. The first peripheral contact plug 61a may penetrate the first upper insulating layer 58 and the second preliminary structure 21 and may be in contact with the preliminary pattern structure 17. The first peripheral contact plug 61a may penetrate the first and second capping insulating layers 32 and 44 of the second preliminary structure 21, and may be spaced apart from the preliminary stack structure 23 and 35 of the second preliminary structure 21. The second peripheral contact plug 61b may penetrate the first upper insulating layer 58, the second preliminary structure 21 and the internal intermediate insulating layer 19a, may extend downwardly, and may be in contact with the first peripheral circuit pad 11p1. The third peripheral contact plug 61c may penetrate the first upper insulating layer 58, the first and second capping insulating layers 32 and 44 of the second preliminary structure 21, and the external intermediate insulating layer 19b, may extend downwardly, and may be in contact with the second peripheral circuit pad 11p2. The dummy plugs 61d may penetrate the first upper insulating layer 58 and the preliminary stack structures 23 and 35 of the second preliminary structure 21 and may be in contact with the pattern structure 17. The dummy plugs 61d may be spaced apart from the first peripheral contact plug 61a and located in the staircase region SA.

The peripheral contact plugs 61a, 61b, and 61c and the dummy plugs 61d may include the plug pattern 60b (in FIG. 4) and the liner layer 60a (in FIG. 4) covering a side surface and a bottom surface of the plug pattern 60b, which may be the same as in FIG. 4.

Figure 9A:
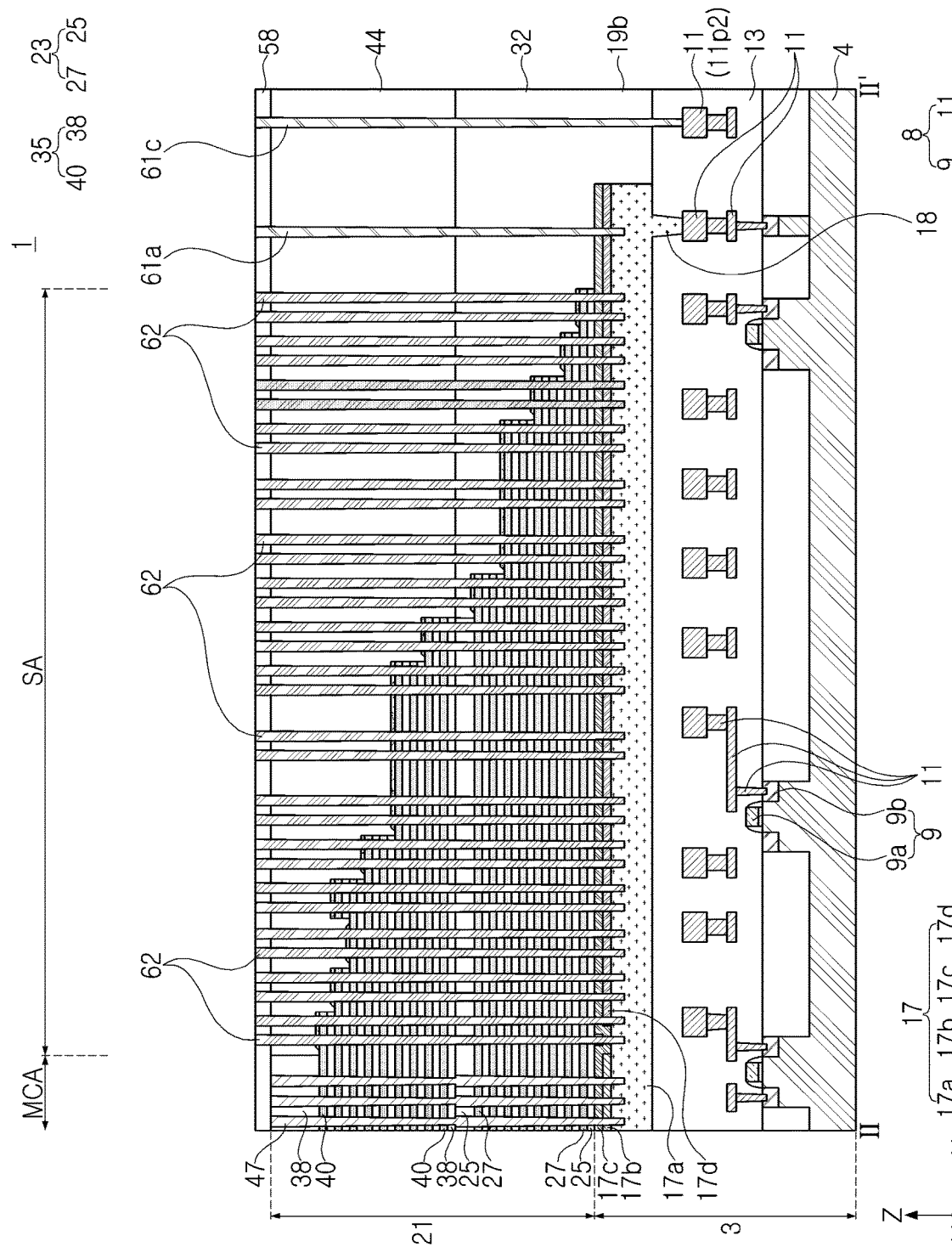
Figure 9B:
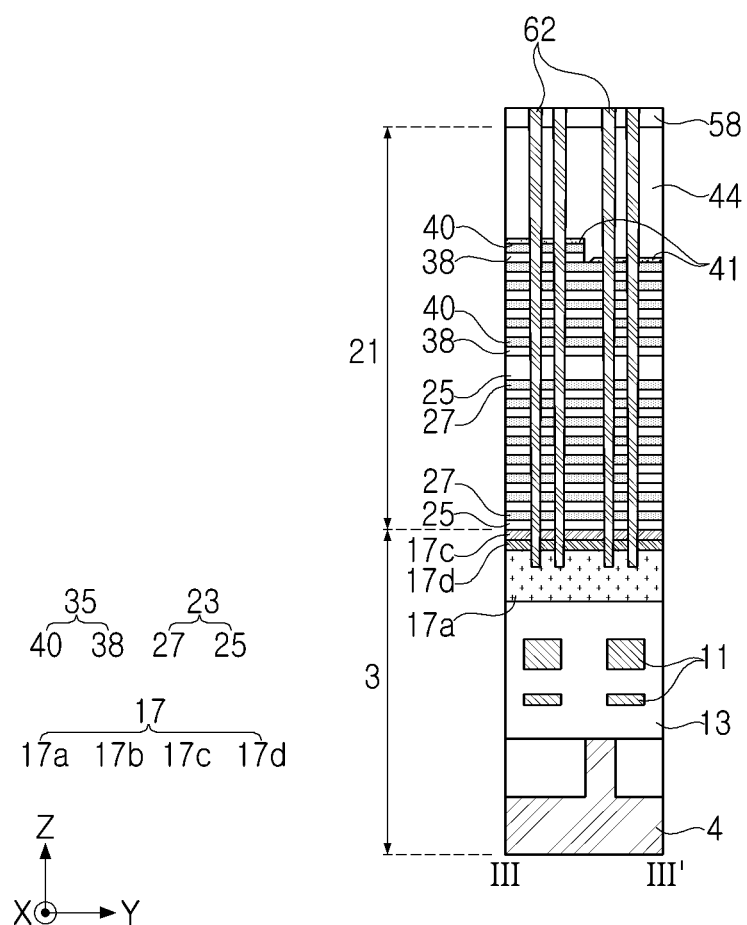

Referring to FIGS. 9A and 9B, the dummy plugs 61d in FIGS. 8B and 8C may be replaced with support vertical structures 62. For example, by removing the dummy plugs 61d in FIGS. 8B and 8C, support holes may be formed, and the support vertical structures 62 may be formed in the support holes. The support vertical structures 62 may be formed of an insulating material such as silicon oxide. Accordingly, the support vertical structures 62 described with reference to FIGS. 2B and 2C may be formed.

In another example, to form the support vertical structures 62' as in the modified example in FIG. 6, by forming the support holes, and partially etching the first and second horizontal layers 27 and 40 exposed by the support holes, widths of the support holes may increase.

Figure 10A:
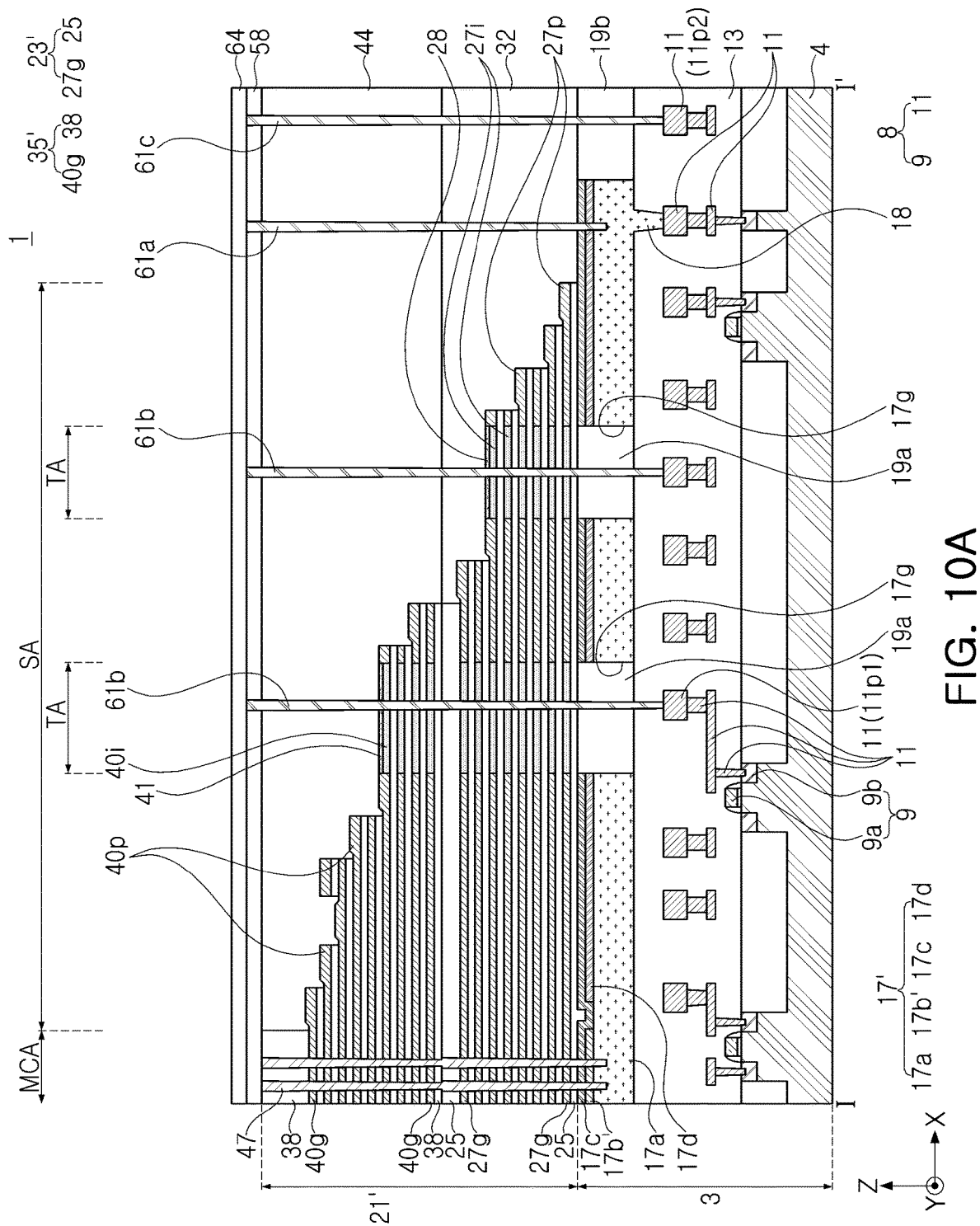
Figure 10B:
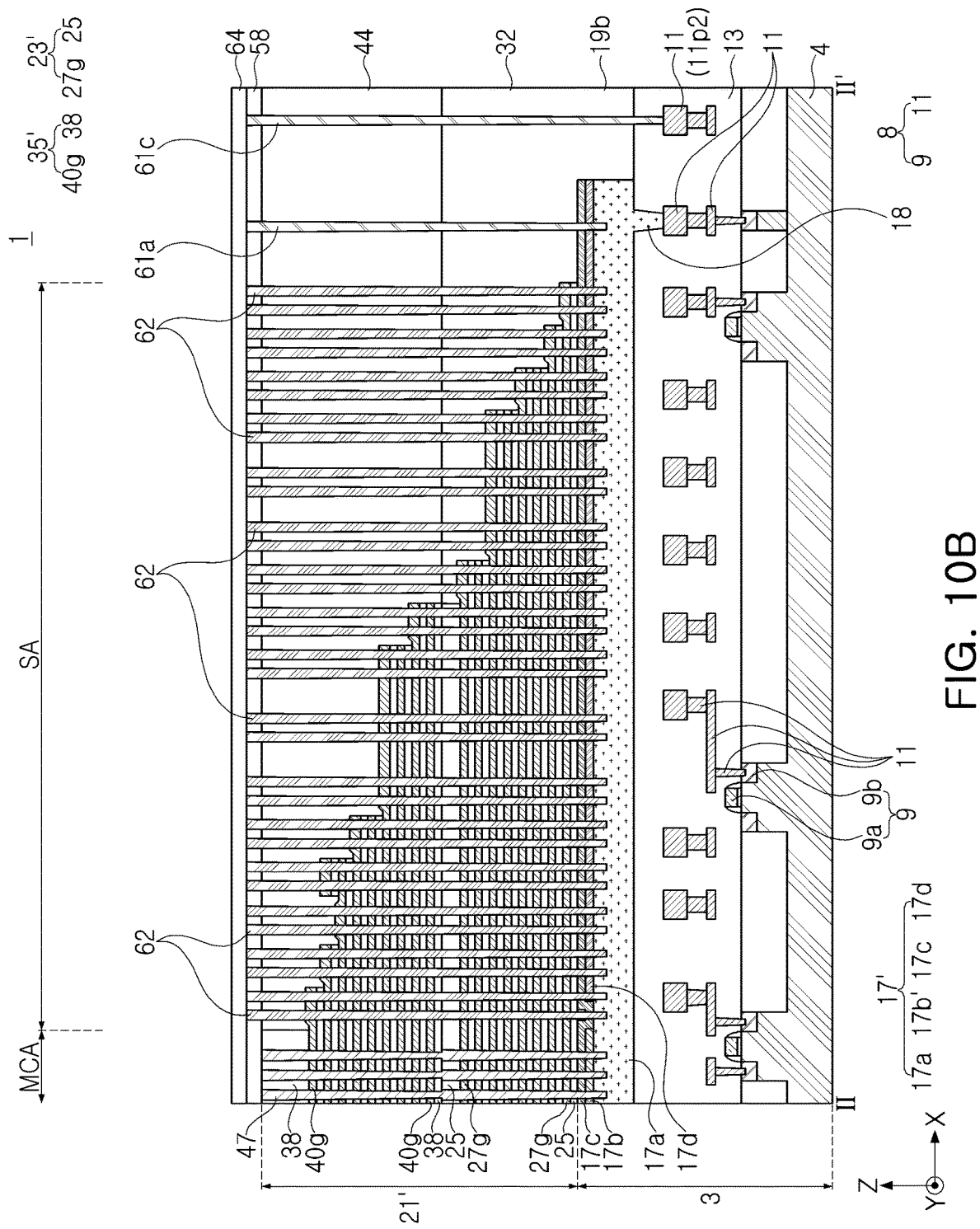
Figure 10C:
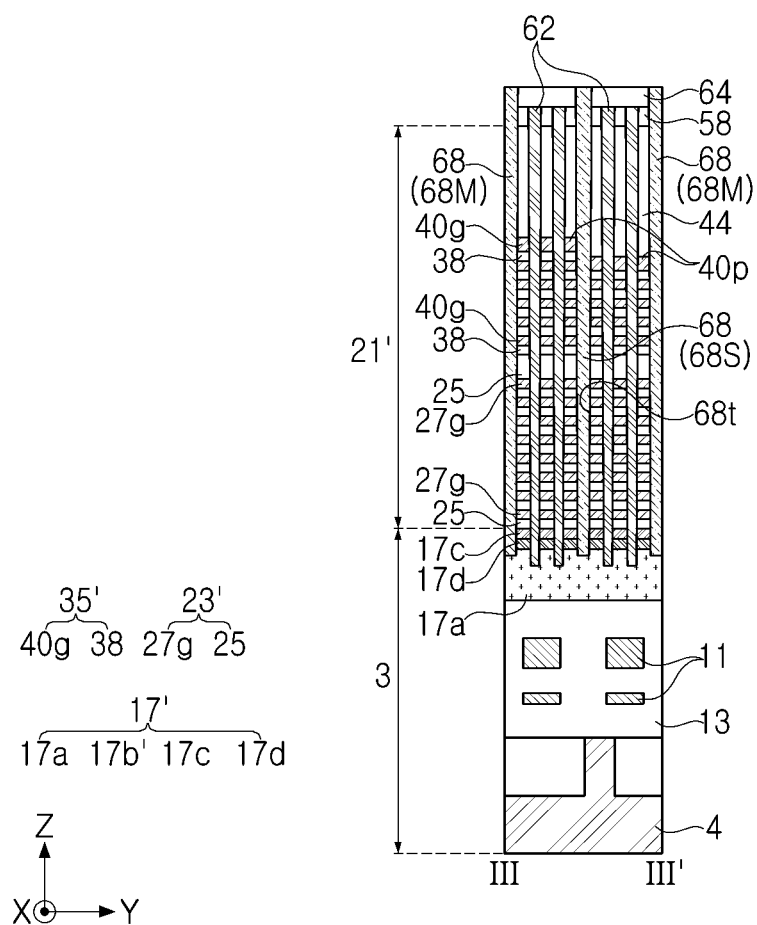

Referring to FIGS. 10A, 10B, and 10C, a second upper insulating layer 64 may be formed on the first upper insulating layer 58. Separation trenches 68t penetrating the second upper insulating layer 64, the first upper insulating layer 58, and the second preliminary structure 21 in order and extending into the preliminary pattern structure 17 may be formed. The separation trenches 68t may expose the first intermediate pattern layer 17b (in FIG. 9A) disposed below the memory cell array region MCA, and may be spaced apart from the second intermediate pattern layer 17d. The first intermediate pattern layer 17b (in FIG. 9A) exposed by the separation trenches 68t may be removed, and a third pattern layer 17b may be formed in the space from which the first intermediate pattern layer 17b (in FIG. 9A) is removed. The third pattern layer 17b' may be formed of a polysilicon layer having N-type conductivity. The remaining second intermediate pattern layer 17d may be referred to as a fourth pattern layer 17d.

Empty spaces may be formed by partially etching the first and second horizontal layers 27 and 40 of the second preliminary structure 21 exposed by the separation trenches 68t, and first and second gate layers 27g and 40g may be formed in the empty spaces. The first preliminary stack structure 23 may be formed as a first stack structure 23' including the first interlayer insulating layers 25 and the first gate layers 27g, and the second preliminary stack structure 35 may be formed as a second stack structure 35' including the second interlayer insulating layers 38 and the second gate layers 40g. Accordingly, the second preliminary structure 21 may be formed as a second structure 21' including the first and second stack structures 23' and 35'.

The first and second horizontal layers 27 and 40 may remain, and may be formed as the first and second insulating horizontal layers 27i and 40i described with reference to FIGS. 1 to 2C. Regions in the second structure 21' in which the first and second insulating horizontal layers 27i and 40i are formed may be referred to as through regions TA.

In an example, before forming the first and second gate layers 27g and 40g in the empty spaces, the dielectric layer 67 described with reference to FIG. 2C may be conformally formed.

The forming the first and second gate layers 27g and 40g in the empty spaces may include forming conductive material layers in the empty spaces and etching the conductive material layers.

Separation structures 68 may be formed in the separation trenches 68t. The separation structures 68 may be formed of silicon oxide.

Referring back to FIGS. 2A, 2B, and 2C, a third upper insulating layer 72 may be formed on the second upper insulating layer 64. Gate contact plugs 75 penetrating the first to third upper insulating layers 58, 64, and 72, extending downwardly, and configured to be in contact with the gate pads 40p may be formed. A fourth upper insulating layer 78 may be formed on the third upper insulating layer 72. A bit line contact plug 81b penetrating the first to fourth upper insulating layers 58, 64, 72, and 78 and electrically connected to the memory vertical structure 47, peripheral upper plugs 81s, 81p1, and 81p2 penetrating the second to fourth upper insulating layers 64, 72, and 78, and gate upper plugs 81g penetrating the fourth upper insulating layer 78 and electrically connected to the gate contact plugs 75 may be formed. Interconnection lines 84b, 84g, and 84p may be formed on the fourth upper insulating layer 78. The interconnection lines 84b, 84g, and 84p may include bit lines 84b electrically connected to the bit line contact plugs 81b, gate interconnection lines 84g electrically connecting each of the gate upper plugs 81g to a plurality of the second peripheral upper plugs 81p1, a first peripheral interconnection line 84s electrically connected to the first peripheral upper plug 81s, and a second peripheral interconnection line 84p electrically connected to the third peripheral upper plug 81p2.

In the description below, a data storage system including the semiconductor device described in an example embodiment of the present disclosure will be described with reference to FIGS. 11, 12, and 13.

Figure 11:
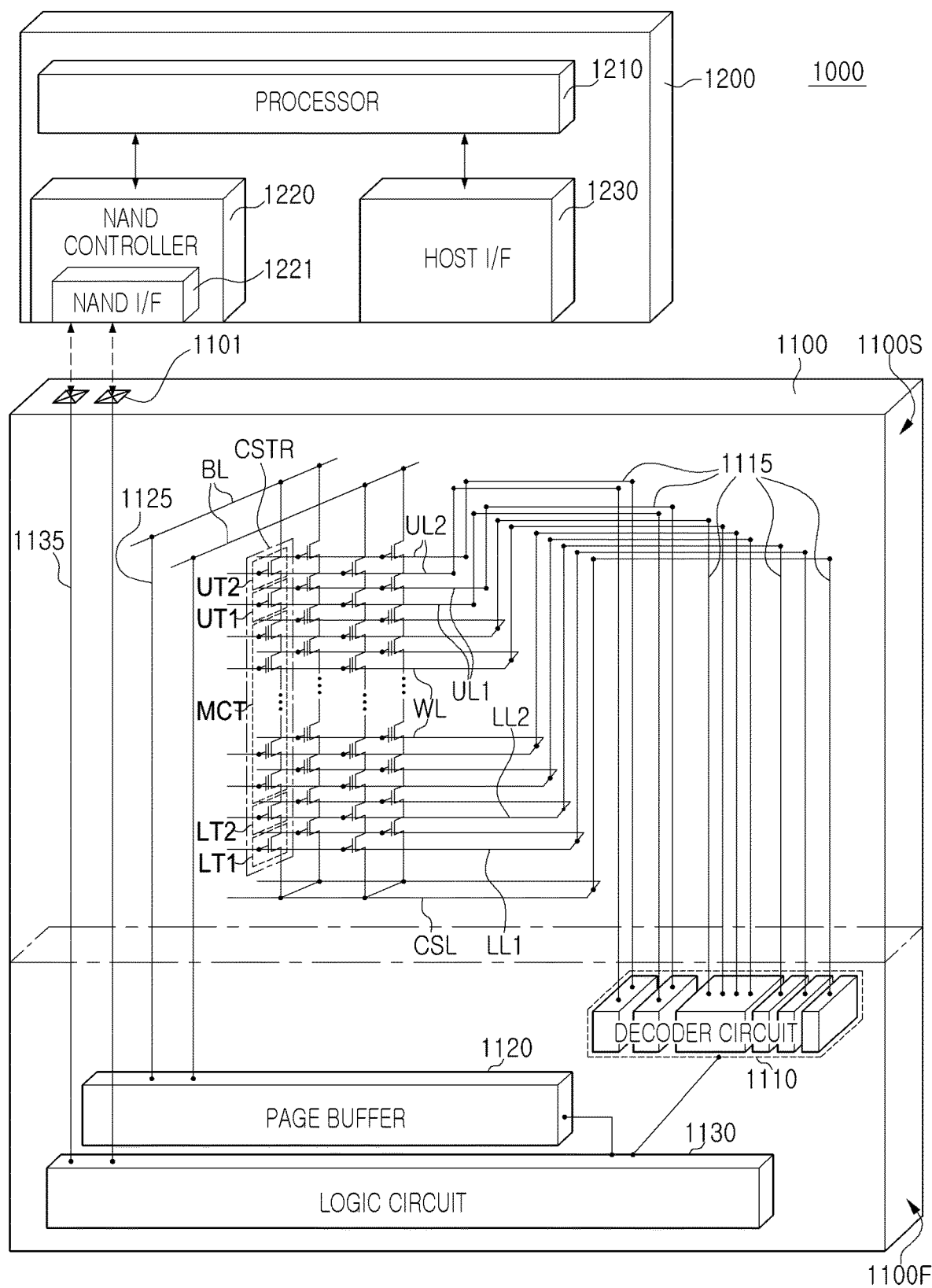
FIG. 11 is a diagram illustrating a data storage system including a semiconductor device according to an example embodiment of the present disclosure.

FIG. 11 is a diagram illustrating a data storage system including a semiconductor device according to an example embodiment of the present disclosure.

Referring to FIG. 11, a data storage system 1000 according to an example embodiment of the present disclosure may include a semiconductor device 1100 and a controller 1200 electrically connected to the semiconductor device 1100. The data storage system 1000 may be implemented as a storage device including the semiconductor device 1100 or an electronic device including a storage device. For example, the data storage system 1000 may be implemented as a solid state drive (SSD) device including the semiconductor device 1100, a universal serial bus (USB), a computing system, a medical device, or a communication device.

In an example embodiment of the present disclosure, the data storage system 1000 may be implemented as an electronic system for storing data.

The semiconductor device 1100 may be the semiconductor device described in one of the aforementioned example embodiments described with reference to FIGS. 1 to 10C. The semiconductor device 1100 may include a first structure 1100F and a second structure 1100S on the first structure 1100F.

The first structure 1100F may be configured as a peripheral circuit structure including a decoder circuit 1110, a page buffer 1120, and a logic circuit 1130. For example, the first structure 1100F may include the peripheral circuit 8 (in FIG. 2A).

The second structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

The pattern structure 17' (in FIGS. 2A to 2C) described above may include a silicon layer having N-type conductivity, and the silicon layer having N-type conductivity may be the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments of the present disclosure.

In example embodiments of the present disclosure, the upper transistors UT1 and UT2 may include string select transistors, and the lower transistors LT1 and LT2 may include ground select transistors. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

Among the first and second gate layers 27g and 40g described with reference to FIG. 5, the lower gate layers GL1 and GL2 may be the gate lower lines LL1 and LL2, at least a plurality of the intermediate gate layers GM may be the word lines WL, and the upper gate layers GU1 and GU2 may be the gate upper lines UL1 and UL2.

In example embodiments of the present disclosure, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used in an erase operation for erasing data stored in the memory cells using gate induce drain leakage (GIDL).

The common source line CSL, the first and second gate lower lines LL1 and LL2, word lines WL, and the first and second gate upper lines UL1 and UL2 may be electrically connected to the decoder circuit 1110 through first interconnection lines 1115 extending from the first structure 1100F to the second structure 1100S.

In example embodiments of the present disclosure, the lower gate layers GL1 and GL2 (in FIG. 2A) described above may be the gate lower lines LL1 and LL2, and the upper gate layers GU1 and GU2 (in FIG. 2A) may be the gate upper lines UL1 and UL2. A plurality of the intermediate gate layers 30M (in FIG. 2A) may be the word lines WL.

The bit lines BL may be electrically connected to the page buffer 1120 through second connection wires 1125 extending from the first structure 1100F to the second structure 1100S. The bit lines BL may be the bit lines 84b in FIGS. 2A and 2B described above.

In the first structure 1100F, the decoder circuit 1110 and the page buffer 1120 may perform a control operation on at least one memory select memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output interconnection line 1135 extending from the first structure 1100F to the second structure 1100S.

The controller 1200 may include a processor 1210, a NAND controller 1220, and a host interface 1230. In example embodiments of the present disclosure, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communications with the semiconductor device 1100. Through the NAND interface 1221, a control command for controlling the semiconductor device 1100, data to be written in the memory cell transistors MCT of the semiconductor device 1100, and data to be read from the memory cell transistors MCT may be transmitted. The host interface 1230 may provide a communication function between the data storage system 1000 and an external host. When a control command is received from an external host through the host interface 1230, the processor 1210 may control the semiconductor device 1100 in response to the control command.

Figure 12:
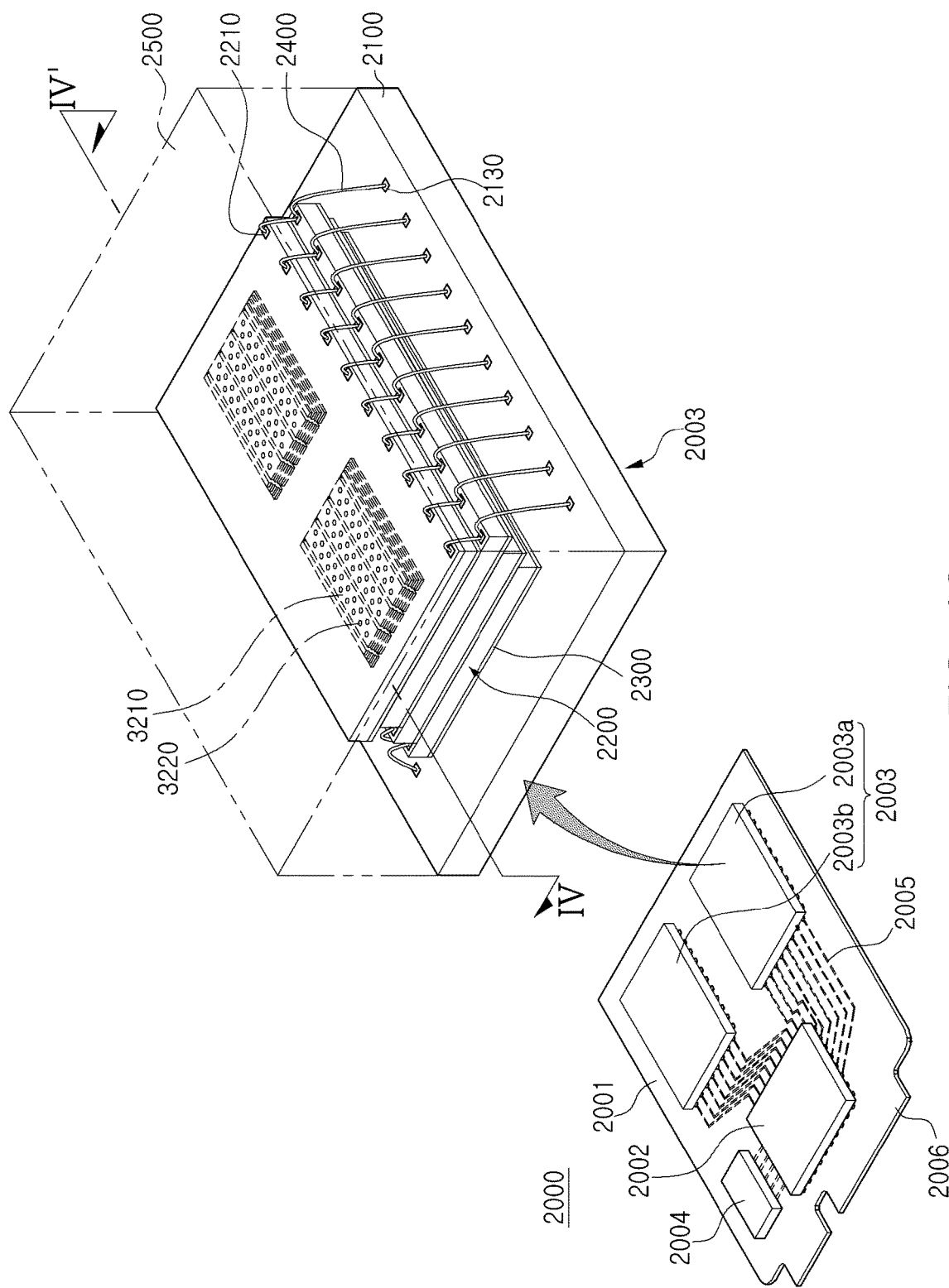
FIG. 12 is a perspective diagram illustrating a data storage system including a semiconductor device according to an example embodiment of the present disclosure.

FIG. 12 is a perspective diagram illustrating a data storage system including a semiconductor device according to an example embodiment of the present disclosure.

Referring to FIG. 12, a data storage system 2000 according to an example embodiment of the present disclosure may include a main substrate 2001, a controller 2002 mounted on the main substrate 2001, one or more semiconductor packages 2003, and a dynamic random access memory (DRAM) 2004. The semiconductor package 2003 and the DRAM 2004 may be connected to the controller 2002 by wiring patterns 2005 formed on the main substrate 2001.

The main substrate 2001 may include a connector 2006 including a plurality of pins to be coupled to an external host. The number and the arrangement of the plurality of pins in the connector 2006 may be varied depending on a communication interface between the data storage system 2000 and the external host. In example embodiments of the present disclosure, the data storage system 2000 may communicate with the external host through one of interfaces such as a universal serial bus (USB), a peripheral component interconnect express (PCI-Express), a serial advanced technology attachment (SATA), and an M-phy for universal flash storage (UFS). In example embodiments of the present disclosure, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may increase an operation speed of the data storage system 2000.

The DRAM 2004 may be configured as a buffer memory for mitigating a difference in speeds between the semiconductor package 2003, which may be a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the semiconductor chips 2200 may include a semiconductor device described in one of the aforementioned example embodiments described with reference to FIGS. 1 to 10C.

Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each of the semiconductor chips 2200 may include an input/output pad 2210.

In example embodiments of the present disclosure, the connection structure 2400 may be a bonding wire electrically connecting the input/output pad 2210 to the upper pads 2130. Accordingly, in each of the first and second semiconductor packages 2003a and 2003b, the semiconductor chips 2200 may be electrically connected to each other through a bonding wire method, and may be electrically connected to the upper pads 2130 of the package substrate 2100. In example embodiments of the present disclosure, in each of the first and second semiconductor packages 2003a and 2003b, the semiconductor chips 2200 may be electrically connected to each other by a connection structure including a through silicon via (TSV), instead of the connection structure 2400 of a bonding wire method.

In example embodiments of the present disclosure, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by wirings formed on the interposer substrate.

Figure 13:
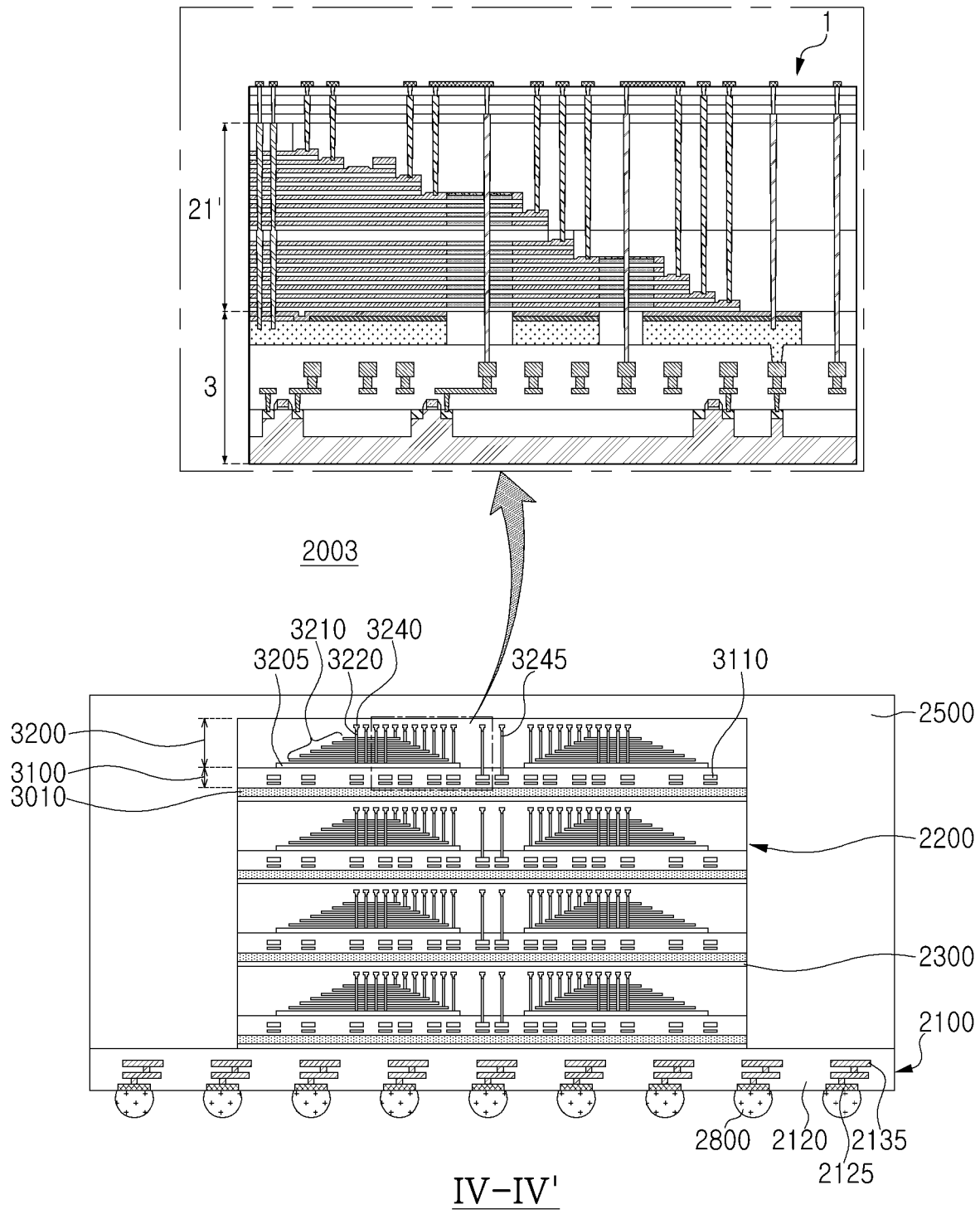
FIG. 13 is a cross-sectional diagram illustrating a data storage system including a semiconductor device according to an example embodiment of the present disclosure.

FIG. 13 is a cross-sectional diagram illustrating a data storage system including a semiconductor device according to an example embodiment of the present disclosure. FIG. 13 illustrates an example embodiment of the semiconductor package 2003 in FIG. 12, illustrating a cross-sectional region of the semiconductor package 2003 in FIG. 12 taken along line IV-IV'.

Referring to FIG. 13, in the semiconductor package 2003, the package substrate 2100 may be configured as a printed circuit board. The package substrate 2100 may include a package substrate body portion 2120, upper pads 2130 disposed on an upper surface of the package substrate body portion 2120, lower pads 2125 disposed on a lower surface of the package substrate body portion 2120 or exposed through the lower surface, and internal wirings 2135 electrically connecting the upper pads 2130 to the lower pads 2125 in the package substrate body portion 2120. The upper pads 2130 may be electrically connected to the connection structures 2400. The lower pads 2125 may be connected to the wiring patterns 2005 of the main substrate 2010 of the data storage system 2000 through conductive connection portions 2800.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral interconnection lines 3110. The second structure 3200 may include a common source line 3205, a gate stack structure 3210 on the common source line 3205, memory channel structures 3220 and separation structures 3230 penetrating the gate stack structure 3210, bit lines 3240 electrically connected to the memory channel structures 3220, and gate interconnection lines 84g (in FIG. 2A) electrically connected to the word lines WL of the gate stack structure 3210. The first structure 3100 may include the first structure 1100F in FIG. 12, and the second structure 3200 may include the second structure 1100S in FIG. 12.

Each of the semiconductor chips 2200 may include a through interconnection 3245 electrically connected to the peripheral interconnection lines 3110 of the first structure 3100 and extending into the second structure 3200. The through interconnection 3245 may penetrate the gate stack structure 3210 and may be further disposed on an external side of the gate stack structure 3210.

Each of the semiconductor chips 2200 may further include an input/output interconnection line 3265 electrically connected to peripheral interconnection lines 3110 of the first structure 3100 and extending into the second structure 3200, and an input/output pad 2210 electrically connected to the input/output interconnection line 3265.

In FIG. 13, the enlarged portion indicated by reference numeral 1 is provided to describe the example in which the semiconductor chips 2200 in FIG. 13 are modified to have a cross-sectional structure as in FIG. 2A. Accordingly, each of the semiconductor chips 2200 may include the semiconductor device 1 in one of the aforementioned example embodiments described with reference to FIGS. 1 to 6.

In another example, each of the semiconductor chips 2200 may include the semiconductor device 100 according to the example embodiment described with reference to FIG. 7.

According to the aforementioned example embodiments of the present disclosure, a semiconductor device including a memory vertical structure, a peripheral contact plug, a support vertical structure, a separation structure, and a gate contact plug, and a data storage system including the same may be provided. The support vertical structure may prevent deformation or warpage of the gate layers stacked and spaced apart from each other in the vertical direction. The memory vertical structure, the peripheral contact plug, the separation structure, and the gate contact plug may have upper surfaces disposed on different levels. By providing the method of forming the separation structure and a semiconductor device formed by the method after the peripheral contact plug and the support vertical structure are formed, a semiconductor device and a data storage system which may increase integration density and reliability may be provided.

While the example embodiments of the present disclosure have been illustrated and described above, it will be apparent to those skilled in the art that modifications and variations could be made thereto without departing from the scope of the present disclosure as set forth by the appended claims.

What is claimed is:

1. A semiconductor device, comprising:
    a memory cell array region and a staircase region on a pattern structure;
    a stack structure disposed in the memory cell array region and extending from the memory cell array region into the staircase region, wherein the stack structure includes interlayer insulating layers and gate layers alternately stacked in a vertical direction perpendicular to an upper surface of the pattern structure, and the gate layers include gate pads arranged in a staircase shape in the staircase region;
    a separation structure penetrating through the stack structure and in contact with the pattern structure;
    a memory vertical structure penetrating through the stack structure in the memory cell array region and in contact with the pattern structure;
    a support vertical structure penetrating through the stack structure in the staircase region and in contact with the pattern structure;
    gate contact plugs disposed on the gate pads; and
    a first peripheral contact plug spaced apart from the gate layers,
    wherein the separation structure extends from the memory cell array region toward the staircase region in a first horizontal direction parallel to the upper surface of the pattern structure,
    wherein an upper surface of the memory vertical structure is disposed at a first level,
    wherein an upper surface of the first peripheral contact plug is disposed at a second level higher than the first level,
    wherein an upper surface of the separation structure is disposed at a third level higher than the second level, and
    wherein upper surfaces of the gate contact plugs are disposed at a fourth level higher than the third level.

2. The semiconductor device of claim 1, further comprising:
    a bit line contact plug on and in contact with the memory vertical structure;

a peripheral upper plug on and in contact with the first peripheral contact plug;
gate upper plugs on and in contact with the gate contact plugs;
a bit line electrically connected to the bit line contact plug;
a peripheral interconnection line electrically connected to the peripheral upper plug; and
gate interconnection lines electrically connected to the gate upper plugs.

3. The semiconductor device of claim 2,
wherein the bit line contact plug includes a side surface not vertically aligned with a side surface of the memory vertical structure,
wherein the peripheral upper plug includes a side surface not vertically aligned with a side surface of the first peripheral contact plug,
wherein a first gate upper plug among the gate upper plugs is in contact with a first gate contact plug among the gate contact plugs, and
wherein the first gate upper plug includes a side surface not vertically aligned with a side surface of the first gate contact plug.

4. The semiconductor device of claim 1,
wherein the memory vertical structure includes a channel layer, and
wherein the support vertical structure does not include a material of the channel layer.

5. The semiconductor device of claim 4, wherein an upper surface of the support vertical structure is disposed at the second level.

6. The semiconductor device of claim 4, wherein a lower end of the support vertical structure is disposed at a level different from a level of a lower end of the separation structure adjacent to the support vertical structure.

7. The semiconductor device of claim 6, wherein the level of the lower end of the support vertical structure is lower than the level of the lower end of the separation structure.

8. The semiconductor device of claim 1,
wherein the pattern structure includes a silicon layer, and
wherein the first peripheral contact plug has a lower surface in contact with the silicon layer.

9. The semiconductor device of claim 1, further comprising:
a semiconductor substrate; and
a peripheral circuit including a first peripheral circuit pad on the semiconductor substrate,
wherein the stack structure further includes a through region,
wherein the through region includes insulating horizontal layers disposed at the same level as a level of the gate layers adjacent to the through region among the gate layers,
wherein the pattern structure is disposed on the peripheral circuit,
wherein the pattern structure includes a gap, and
wherein the first peripheral contact plug is in contact with the first peripheral circuit pad, extends upwardly and penetrates through the gap and the insulating horizontal layers of the through region.

10. The semiconductor device of claim 1, further comprising:
a semiconductor substrate;
a peripheral circuit including a first peripheral circuit pad on the semiconductor substrate; and
a second peripheral contact plug,
wherein the stack structure further includes a through region,
wherein the through region includes insulating horizontal layers disposed at the same level as a level of the gate layers adjacent to the through region,
wherein the pattern structure is disposed on the peripheral circuit,
wherein the pattern structure includes a gap,
wherein the second peripheral contact plug is in contact with the first peripheral circuit pad, extends upwardly, and penetrates through the gap and the insulating horizontal layers of the through region, and
wherein an upper surface of the second peripheral contact plug is disposed at the second level.

11. The semiconductor device of claim 10, further comprising:
a third peripheral contact plug,
wherein the peripheral circuit further includes a second peripheral circuit pad,
wherein the third peripheral contact plug is in contact with the second peripheral circuit pad on an external side of the pattern structure and extends upwardly, and
wherein an upper surface of the third peripheral contact plug is disposed at the second level.

12. The semiconductor device of claim 1, further comprising:
a dielectric layer,
wherein the separation structure includes separation protrusions protruding in a direction toward gate layers adjacent to the separation structure among the gate layers,
wherein the separation structure is in contact with gate layers adjacent to the separation structure among the gate layers,
wherein the dielectric layer includes a first dielectric portion and a second dielectric portion,
wherein the first dielectric portion covers upper and lower surfaces of each of the gate layers, is disposed between at least one of the gate layers and the memory vertical structure, and is disposed between at least one of the gate layers and the support vertical structure, and
wherein the second dielectric portion extends from the first dielectric portion and covers a side surface of the separation structure not in contact with the gate layers.

13. The semiconductor device of claim 12,
wherein the separation structure includes silicon oxide, and
wherein the dielectric layer includes a high-k dielectric having a dielectric constant higher than that of silicon oxide.

14. The semiconductor device of claim 1,
wherein the stack structure includes a first stack structure and a second stack structure on the first stack structure,
wherein the first stack structure includes first interlayer insulating layers and first gate layers alternately stacked in the vertical direction,
wherein the second stack structure includes second interlayer insulating layers and second gate layers alternately stacked in the vertical direction,
wherein the first and second interlayer insulating layers form the interlayer insulating layers,
wherein the first and second gate layers form the gate layers, and
wherein a side surface of the memory vertical structure disposed between an uppermost first gate layer among the first gate layers and a lowermost second gate layer among the second gate layers includes a bent portion.

15. The semiconductor device of claim 14,
wherein a side surface of the separation structure has a substantially linear shape at the same level as a level of the bent portion of the side surface of the memory vertical structure, and
wherein a side surface of the first peripheral contact plug has a substantially linear shape at the same level as a level of the bent portion of the side surface of the memory vertical structure.

16. The semiconductor device of claim 1,
wherein the support vertical structure includes support protrusions protruding in a direction toward the gate layers adjacent to the support vertical structure among the gate layers,
wherein the separation structure includes separation protrusions protruding in a direction toward the gate layers adjacent to the separation structure among the gate layers, and
wherein a width of a first separation protrusion of one of the separation protrusions is greater than a width of a first support protrusion of one of the support protrusions.

17. The semiconductor device of claim 1, further comprising:
a semiconductor substrate;
a peripheral circuit disposed below the semiconductor substrate;
upper bonding pads disposed below the peripheral circuit; and
lower bonding pads disposed below the upper bonding pads and bonded to the upper bonding pads,
wherein the lower bonding pads are disposed on the stack structure.

18. A semiconductor device, comprising:
a first structure;
a second structure overlapping the first structure in a vertical direction;
a memory vertical structure;
a support vertical structure;
a peripheral contact plug;
a separation structure; and
gate contact plugs,
wherein the first structure includes a pattern structure including a silicon layer,
wherein the second structure includes gate layers stacked and spaced apart from each other in the vertical direction in a memory cell array region and extending from the memory cell array region into a staircase region adjacent to the memory cell array region,
wherein the gate layers include gate pads arranged in the staircase region,
wherein the memory vertical structure contacts the pattern structure and penetrates through the gate layers in the memory cell array region,
wherein the support vertical structure contacts the pattern structure and penetrates through the gate layers in the staircase region,
wherein the peripheral contact plug is spaced apart from the gate layers,
wherein the separation structure contacts the pattern structure and penetrates through the second structure,
wherein the gate contact plugs are disposed on the gate pads,
wherein an upper surface of the memory vertical structure is disposed at a first level,
wherein an upper surface of the peripheral contact plug is disposed at a second level,
wherein an upper surface of the separation structure is disposed at a third level,
wherein upper surfaces of the gate contact plugs are disposed at a fourth level, and
wherein the first to fourth levels are disposed at different levels.

19. The semiconductor device of claim 18,
wherein the second level is higher than the first level,
wherein the third level is higher than the second level, and
wherein the fourth level is higher than the third level.

20. A data storage system, comprising:
a substrate;
a semiconductor device on the substrate; and
a controller electrically connected to the semiconductor device and controlling the semiconductor device,
wherein the semiconductor device includes;
a memory cell array region and a staircase region on a pattern structure;
a stack structure disposed in the memory cell array region and extending from the memory cell array region into the staircase region, wherein the stack structure includes interlayer insulating layers and gate layers alternately stacked in a vertical direction, and the gate layers include gate pads arranged in a staircase shape in the staircase region;
a separation structure contacting the pattern structure and penetrating through the stack structure;
a memory vertical structure contacting the pattern structure and penetrating through the stack structure in the memory cell array region;
a support vertical structure contacting the pattern structure and penetrating through the stack structure in the staircase region;
gate contact plugs disposed on the gate pads; and
a first peripheral contact plug spaced apart from the gate layers,
wherein an upper surface of the memory vertical structure is disposed at a first level,
wherein an upper surface of the first peripheral contact plug is disposed at a second level higher than the first level,
wherein an upper surface of the separation structure is disposed at a third level higher than the second level,
wherein upper surfaces of the gate contact plugs are disposed at a fourth level higher than the third level,
wherein the memory vertical structure includes a channel layer, and
wherein the support vertical structure does not include a material of the channel layer.

* * * * *